(12) United States Patent
Yonetani

(10) Patent No.: US 11,287,488 B2
(45) Date of Patent: Mar. 29, 2022

(54) MAGNETIC SENSOR DEVICE

(71) Applicant: ABLIC Inc., Tokyo (JP)

(72) Inventor: Hiroyuki Yonetani, Tokyo (JP)

(73) Assignee: ABLIC INC., Tokyo (JP)

( * ) Notice: Subject to any disclaimer, the term of this patent is extended or adjusted under 35 U.S.C. 154(b) by 0 days.

(21) Appl. No.: 17/205,651

(22) Filed: Mar. 18, 2021

(65) Prior Publication Data

US 2021/0302510 A1 Sep. 30, 2021

(30) Foreign Application Priority Data

Mar. 27, 2020 (JP) .............................. JP2020-057014

(51) Int. Cl.
*G01R 33/07* (2006.01)
*G01R 33/00* (2006.01)

(52) U.S. Cl.
CPC ......... *G01R 33/07* (2013.01); *G01R 33/0017* (2013.01); *G01R 33/0041* (2013.01)

(58) Field of Classification Search
CPC ............ G01R 33/0017; G01R 33/0041; G01R 33/075
See application file for complete search history.

(56) References Cited

U.S. PATENT DOCUMENTS

| | | | |
|---|---|---|---|
| 2008/0094055 A1* | 4/2008 | Monreal | G01R 33/02 324/117 H |
| 2009/0009164 A1 | 1/2009 | Utsuno | |
| 2012/0274314 A1 | 11/2012 | Cesaretti et al. | |
| 2014/0009221 A1* | 1/2014 | Motz | G01R 33/0082 327/564 |
| 2016/0363638 A1* | 12/2016 | Daubert | G01R 33/075 |
| 2019/0369168 A1* | 12/2019 | Ruck | G01R 33/0029 |

FOREIGN PATENT DOCUMENTS

| | | |
|---|---|---|
| JP | 2008-309626 A | 12/2008 |
| JP | 2014-517919 A | 7/2014 |

\* cited by examiner

*Primary Examiner* — Alvaro E Fortich
(74) *Attorney, Agent, or Firm* — Crowell & Moring LLP

(57) ABSTRACT

Provided is a magnetic sensor device including: a current input terminal; a voltage input terminal; an output terminal; a magnetic sensor circuit including a first terminal, one of one Hall element and a set of Hall elements connected in parallel to each other, and a pilot signal generating circuit; a chopper modulator/demodulator circuit including a first mixer connected to the magnetic sensor circuit, an amplifier containing an input port connected to the first mixer, a second mixer containing an input port connected to the amplifier, and an output port connected to the output terminal; and a feedback circuit including a second terminal connected to the chopper modulator/demodulator circuit, a third mixer, a voltage-current conversion circuit, and a third terminal connected to the current input terminal and the first terminal, and a fourth terminal connected to the voltage input terminal.

6 Claims, 18 Drawing Sheets

MAGNETIC SENSOR DEVICE

RELATED APPLICATIONS

This application claims priority to Japanese Patent Application No. 2020-057014, filed on Mar. 27, 2020, the entire content of which is incorporated herein by reference.

BACKGROUND OF THE INVENTION

1. Field of the Invention

The present invention relates to a magnetic sensor device.

2. Description of the Related Art

A magnetic sensor device using a Hall element requires a mechanism for adjusting magnetic field sensitivity to a desired value, and means for self-correcting the magnetic field sensitivity is proposed. There is known the following drive method. Each period of two phases of a normal spinning operation is halved and assigned to a reference-field-signal sensing period. Variation in magnetic field sensitivity of a measured-magnetic-field-responsive signal is corrected depending on variation in a reference magnetic field signal (see Japanese Patent Translation Publication No. 2014-517919). Further, as a drive method involving removing an offset voltage under no magnetic field, a spinning current method is known (see Japanese Patent Application Laid-open No. 2008-309626).

In Japanese Patent Translation Publication No. 2014-517919, a half of the time period for processing the measured-magnetic-field-responsive signal is assigned to the reference-field-signal sensing period for time division processing. Thus, a signal to noise ratio, i.e., an SN in sensing the magnetic field is reduced as compared to a case in which all time is the time period for processing the measured-magnetic-field-responsive signal. Further, in Japanese Patent Translation Publication No. 2014-517919, because a plurality of Hall elements are required, the offset may become larger due to a mismatch between the Hall elements than an offset under the effect of a remaining magnetic field.

SUMMARY OF THE INVENTION

The present invention has been made in view of the above-mentioned circumstances, and therefore has an object to provide a magnetic sensor device capable of providing output signal while adjusting magnetic field measuring sensitivity at all times with one Hall element or a set of Hall elements connected in parallel to each other. According to one embodiment of the present invention, there is provided a magnetic sensor device including: a current input terminal; a voltage input terminal; an output terminal; a magnetic sensor circuit including a first terminal, one of one Hall element and a set of Hall elements connected in parallel to each other, and a pilot signal generating circuit; a chopper modulator/demodulator circuit including a first mixer connected to the magnetic sensor circuit, an amplifier containing an input port connected to the first mixer, a second mixer containing an input port connected to the amplifier, and an output port connected to the output terminal; and a feedback circuit including a second terminal connected to the chopper modulator/demodulator circuit, a third mixer, a voltage-current conversion circuit, and a third terminal connected to the current input terminal and the first terminal, and a fourth terminal connected to the voltage input terminal.

According to the magnetic sensor device of the one embodiment, an output signal can be provided while adjusting magnetic field measuring sensitivity at all times with one Hall element or a set of Hall elements connected in parallel to each other.

DETAILED DESCRIPTION OF THE PREFERRED EMBODIMENTS

Now, a magnetic sensor device according to embodiments of the present invention is described with reference to the drawings.

First Embodiment

Figure 1:
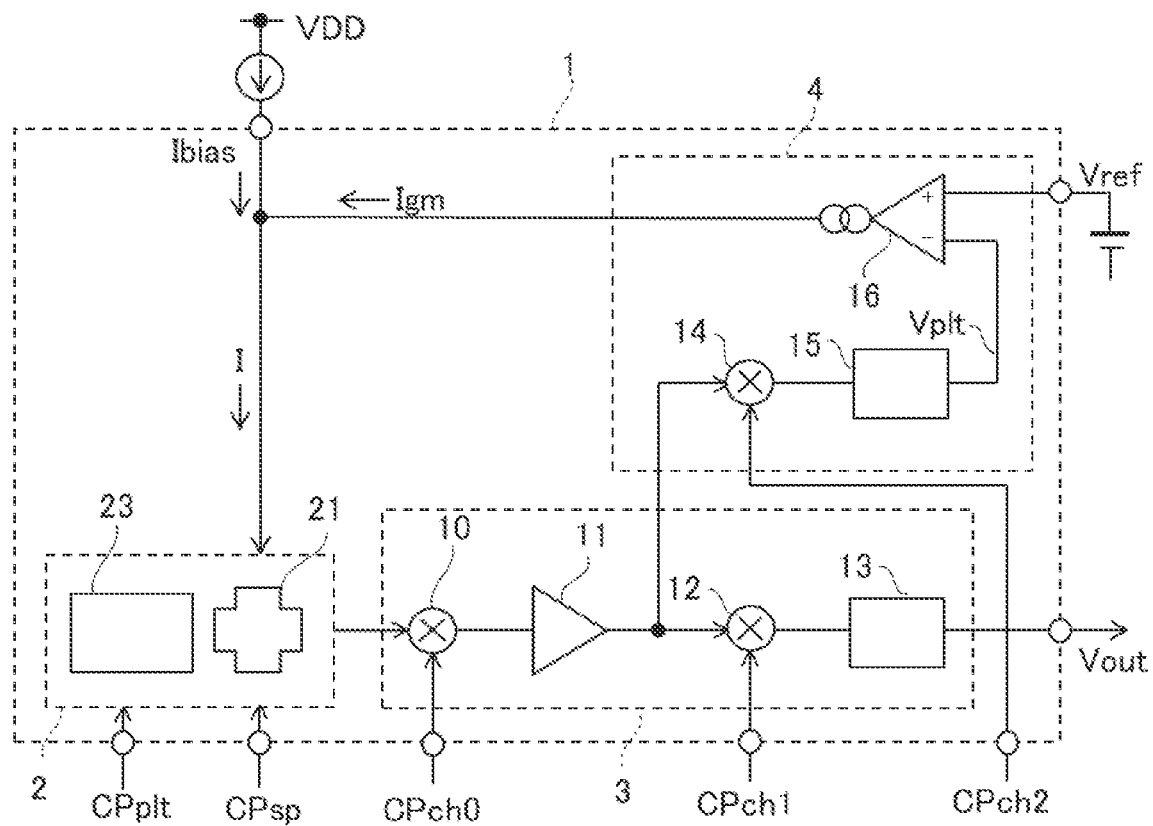
FIG. 1 is a block diagram for illustrating an example of a magnetic sensor device according to a first embodiment of the present invention.

Referring to FIG. 1, a magnetic sensor device 1 as a magnetic sensor device according to a first embodiment of the present invention is described. The magnetic sensor device 1 includes a magnetic sensor circuit 2, a chopper modulator/demodulator circuit 3, a feedback circuit 4, a current Ibias input terminal, a reference voltage Vref input terminal, five clock input terminals, and a voltage Vout output terminal. The magnetic sensor device 1 receives an electric current Ibias from a constant current source, a reference voltage Vref from a constant voltage source, and five clock signals, to thereby supply a signal corresponding to a measured magnetic field from the voltage Vout output terminal. The measured magnetic field is measured by a Hall element 21.

An internal circuit of the magnetic sensor device 1 is described. The magnetic sensor circuit 2 is configured to measure a magnetic field to be applied to the Hall element 21, and supply a measured signal to the chopper modulator/demodulator circuit 3. The chopper modulator/demodulator circuit 3 is configured to chopper-modulate, amplify, and chopper-demodulate the input signal, and supply the signal corresponding to the measured magnetic field to the voltage Vout output terminal. At the same time, the chopper modulator/demodulator circuit 3 is configured to cause the amplified signal to branch to the feedback circuit 4. The feedback circuit 4 is configured to generate, based on the input signal and the reference voltage Vref, an electric current Igm for adjusting sensitivity of the Hall element 21. The electric current Igm is added to the electric current Ibias to be supplied to the magnetic sensor circuit 2.

Figure 2:
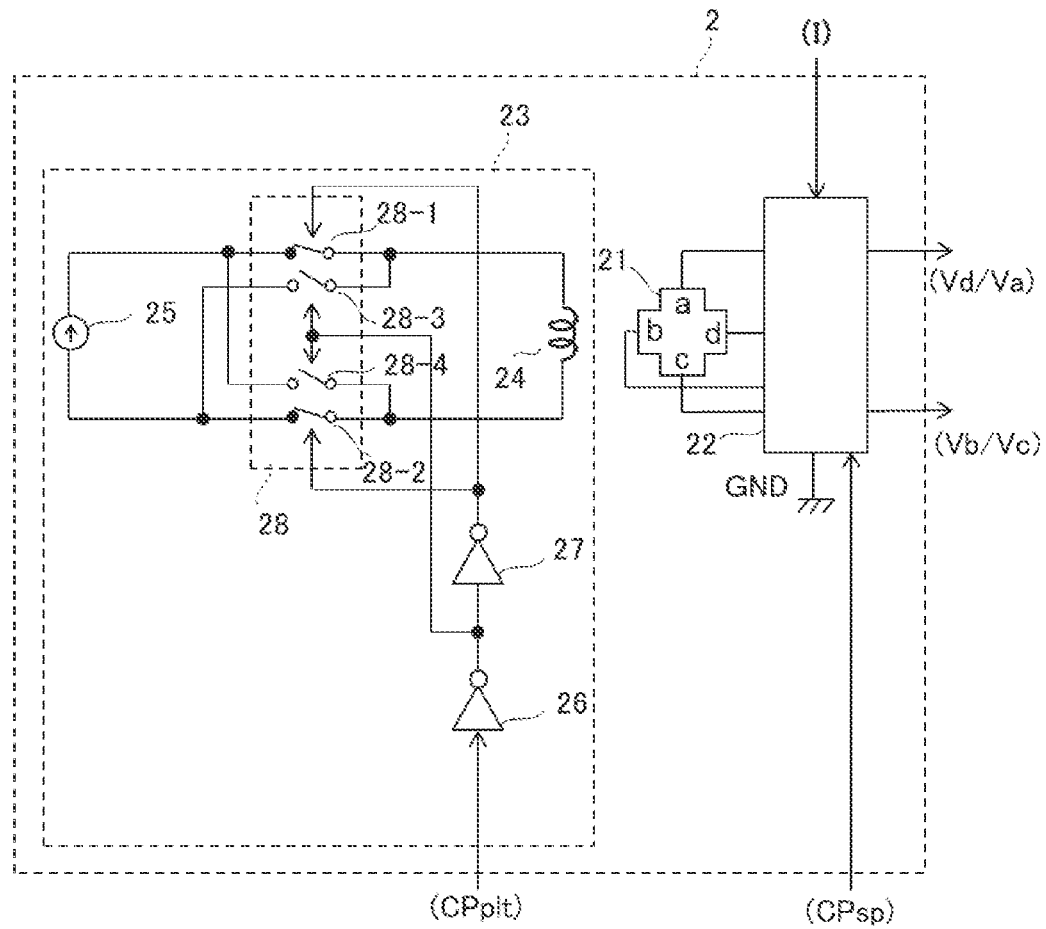
FIG. 2 is a circuit diagram for illustrating an example of a magnetic sensor circuit in the first embodiment.

Referring to FIG. 2, the magnetic sensor circuit 2 configured to measure the magnetic field with the Hall element 21 is described. The magnetic sensor circuit 2 includes the Hall element 21 configured to perform a spinning current operation, a switch circuit 22, and a reference magnetic field generating circuit 23 configured to apply a reference magnetic field to the Hall element 21. The Hall element 21 is switched in connection with the switch circuit 22, and is configured to remove an offset voltage of an output signal under application of no magnetism through operation using a spinning current method. The switch circuit 22 has a current input terminal, a GND connection terminal, four Hall element connection terminals, a clock input terminal, and two output terminals.

Figure 3:
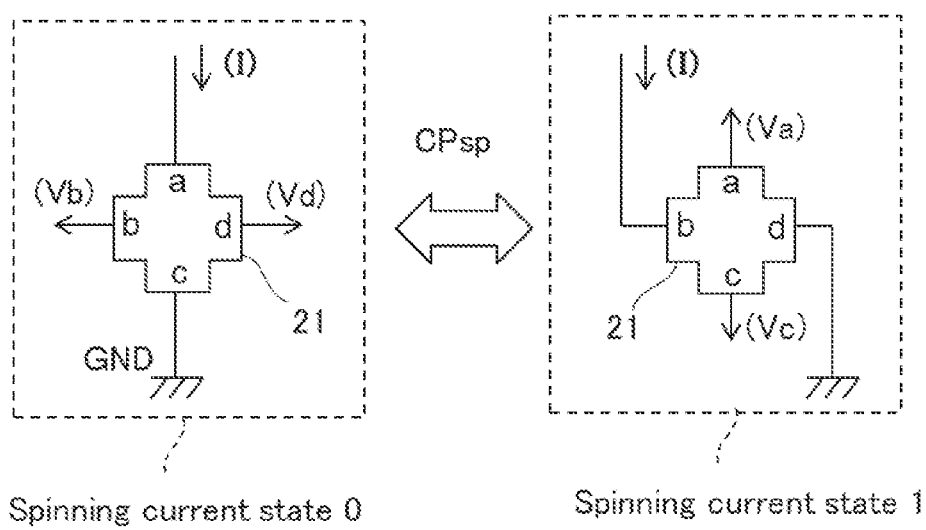
FIG. 3 is a diagram for illustrating spinning current states of a Hall element in the first embodiment.

An outline of the spinning current operation of the Hall element 21 is shown in FIG. 3. The Hall element 21 has four terminals: terminals "a" to "d", and is connected to the switch circuit 22. Under a spinning current state 0, an electric current I is supplied to the terminal "a" of the Hall element 21, and is discharged from the terminal "c" of the Hall element 21. The Hall element 21 is configured to generate a potential that is proportional to a magnetic field perpendicular to the Hall element 21 and is proportional to the electric current I between the terminal "b" and the terminal "d", and supply the potential as a voltage Vb from the terminal "b", and as a voltage Vd from the terminal "d". Under a spinning current state 1, the electric current I is supplied to the terminal "b" of the Hall element 21, and is discharged from the terminal "d" of the Hall element 21. The Hall element 21 is configured to generate a potential that is proportional to the magnetic field perpendicular to the Hall element 21 and is proportional to the electric current I, and supply the potential as a voltage Va from the terminal "a", and as a voltage Vc from the terminal "c". Switching between the spinning current state 0 and the spinning current state 1 is performed with a clock CPsp signal being supplied to the switch circuit 22. The switch circuit 22 is configured to supply the voltage Vd or Va (hereinafter referred to as "Vd/Va") from a first output terminal, and supply the voltage Vb or Vc (hereinafter referred to as "Vb/Vc") from a second output terminal. The Hall element 21 is described taking one Hall element as an example, but may be a plurality of Hall elements having all terminals connected in parallel to one another and being electrically equivalent to one Hall element. The parallel connection of the plurality of Hall elements is a method effective for a case in which a small Hall element is insufficient in drive capability, and a space for mounting the Hall element is limited in shape.

Referring to FIG. 2, the reference magnetic field generating circuit 23 is further described. The reference magnetic field generating circuit 23 includes a coil 24, a constant current source 25, inverters 26 and 27, and a switch circuit 28. The constant current source 25 is connected to the switch circuit 28. The switch circuit 28 includes four switches: switches 28-1 to 28-4, and is controlled with a clock CPplt signal supplied via the inverters 26 and 27. The switch circuit 28 is configured to switch a direction of an electric current at a time of being supplied to the coil 24 with the clock CPplt signal, the electric current being supplied from the constant current source 25. For example, with the clock CPplt signal at a high level H, the switch 28-1 and the switch 28-2 are turned on, a first terminal of the constant current source 25 is connected to a first terminal of the coil 24, and a second terminal of the constant current source 25 is connected to a second terminal of the coil 24. With the clock CPplt signal at a low level L, the switch 28-3 and the switch 28-4 are turned on, the first terminal of the constant current source 25 is connected to the second terminal of the coil 24, and the second terminal of the constant current source 25 is connected to the first terminal of the coil 24.

The reference magnetic field generating circuit 23 is configured to supply the electric current generated by the constant current source 25 to the coil 24 to generate a magnetic field as a reference, and apply the magnetic field generated by the coil 24 to the Hall element 21. The coil 24 is arranged so that the generated magnetic field can be applied efficiently in a direction in which magnetic field sensitivity of the Hall element 21 is highest. The coil 24 may have any coil shape as long as the magnetic field can be generated efficiently. For example, as long as a large electric current can be supplied to the coil 24, the coil 24 may be one conductor wire.

The reference magnetic field generated by the reference magnetic field generating circuit 23 is an AC magnetic field. The AC magnetic field is generated by the clock CPplt signal being supplied to the switch circuit 28 via the inverters 26 and 27, has a constant magnitude, and alternates between magnetic field directions.

The reference magnetic field generating circuit 23 is configured to generate the reference magnetic field at the following timing, and apply the generated reference magnetic field to the Hall element 21.

The reference magnetic field generating circuit 23 switches, under the spinning current state 0, a direction of an electric current to be supplied to the coil 24 with the clock CPplt signal, to thereby switch a direction of the reference magnetic field to be applied to the Hall element 21 at a duty ratio of 50%. Similarly under the spinning current state 1, the reference magnetic field generating circuit 23 switches the direction of the electric current to be supplied to the coil 24 with the clock CPplt signal, to thereby switch the direction of the reference magnetic field to be applied to the Hall element 21 at the duty ratio of 50%.

The magnetic sensor circuit 2 supplies the signals Vd/Va and Vb/Vc supplied by the Hall element 21. The signals supplied by the magnetic sensor circuit 2 to correspond to the magnetic field applied by the reference magnetic field generating circuit 23 are hereinafter referred to as "pilot signals." The reference magnetic field generating circuit 23 operates as a pilot signal generating circuit, and thereby generates the pilot signals superimposed on the output signal supplied from the Hall element 21.

The magnetic sensor circuit 2 is configured to supply a signal obtained by superimposing a signal corresponding to the measured magnetic field penetrating the Hall element 21 with the pilot signals. The signals Vd/Va and Vb/Vc supplied by the magnetic sensor circuit 2 are supplied to the chopper modulator/demodulator circuit 3.

Figure 4:
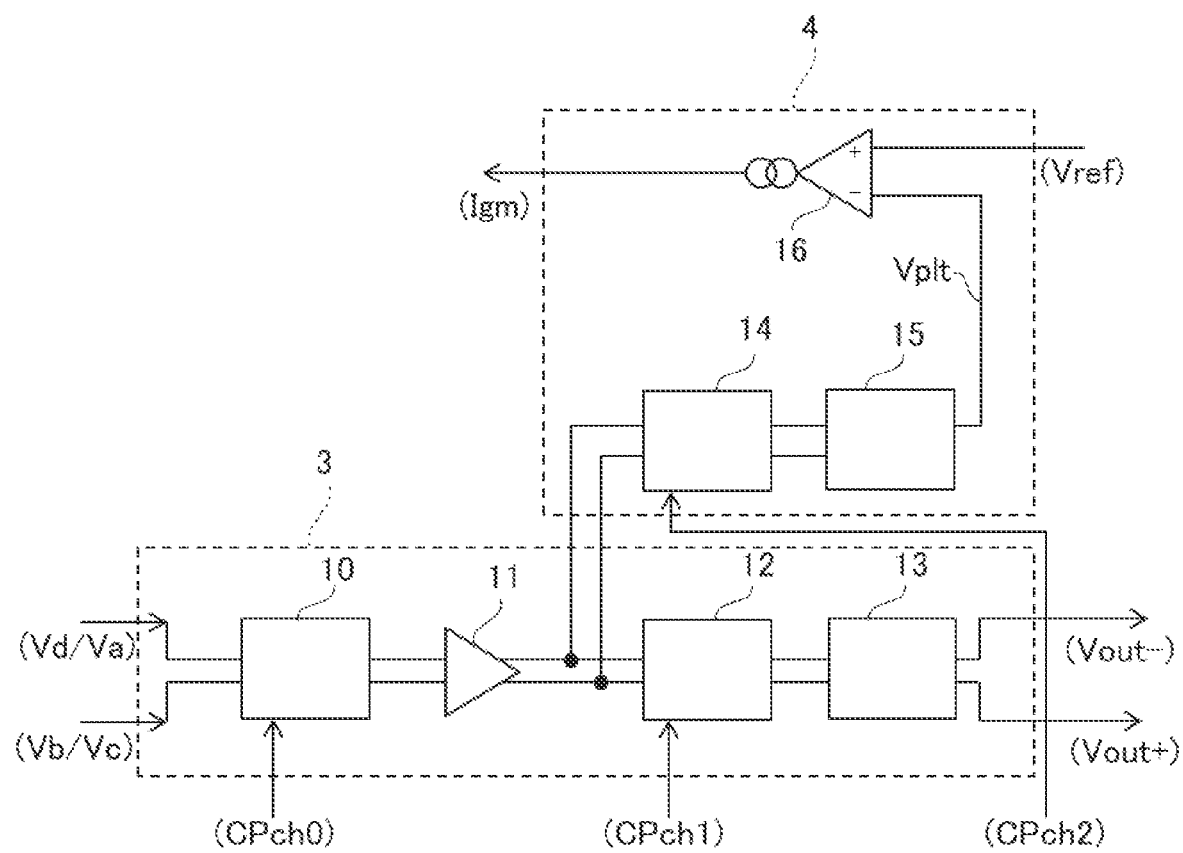
FIG. 4 is a block diagram for illustrating an example of a chopper modulator/demodulator circuit and a feedback circuit in the first embodiment.

Referring to FIG. 4, the chopper modulator/demodulator circuit 3 is described. The chopper modulator/demodulator circuit 3 includes mixers 10 and 12, an amplifier 11, and an LPF circuit 13. The mixers 10 and 12 are passive analog multipliers.

The signals Vd/Va and Vb/Vc are supplied by the magnetic sensor circuit 2 to the mixer 10 of the chopper modulator/demodulator circuit 3. Outputs of the mixer 10 are supplied to the amplifier 11. As the amplifier 11, an amplifier using an FET, for example, on an input side and having a high input impedance is used. Outputs of the amplifier 11 are supplied to the mixer 12. Outputs of the mixer 12 are supplied to the LPF circuit 13. Outputs of the LPF circuit 13 are supplied from the voltage Vout output terminal. A flow of the signals from the mixer 12 to the LPF circuit 13 is called an "in-phase side," and is hereinafter referred to as "I side."

Figure 5:
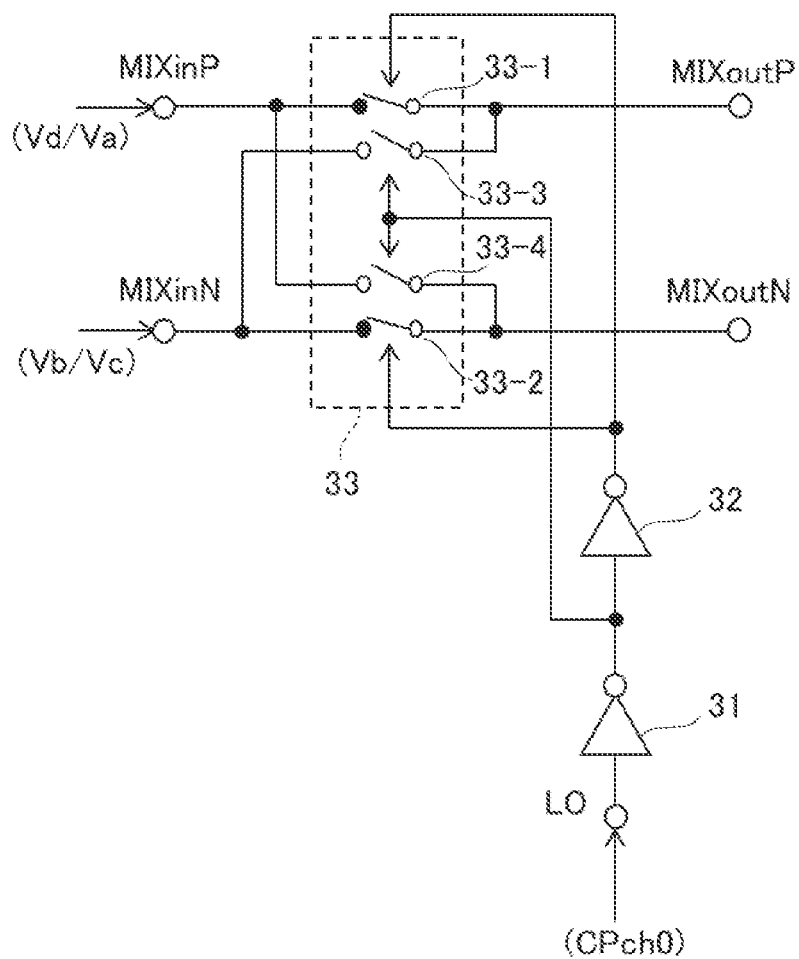
FIG. 5 is a circuit diagram for illustrating an example of a mixer circuit in the first embodiment.

Referring to FIG. 5, the mixer 10 is described. The mixer 10 includes inverters 31 and 32, a switch circuit 33, an LO terminal, input terminals, and output terminals. To the LO terminal, a clock CPch0 signal is supplied.

The input signals Vd/Va and Vb/Vc supplied to the mixer 10 are differential signals including a positive signal MIXinP and a negative signal MIXinN, and output signals from the mixer 10 are also differential signals including a positive signal MIXoutP and a negative signal MIXoutN. The mixer 12 has the same configuration as that of the mixer 10, and a clock CPch1 signal is supplied to the LO terminal. Outputs of the mixer 12 are supplied to the LPF circuit 13, and only low-frequency components are supplied from the voltage Vout output terminal of the magnetic sensor device 1. A voltage Vout supplied from the voltage Vout output terminal is an output signal corresponding to the measured magnetic field applied to the Hall element 21.

Operation of the chopper modulator/demodulator circuit 3 is described. The signals Vd/Va and Vb/Vc supplied from the magnetic sensor circuit 2 are supplied to the mixer 10 of the chopper modulator/demodulator circuit 3. The input signals supplied to the mixer 10 from the magnetic sensor circuit 2 are differential signals. The mixer 10 is configured to multiply the differential input signals and the clock CPch0 signal in the switch circuit 33, and supply the multiplied signals as differential output signals. The differential output signals are supplied from the mixer 10 to the amplifier 11.

The amplifier 11 is configured to amplify the supplied differential input signals by a gain "A", and amplified differential output signals are supplied to the mixer 12. Here, the gain "A" is larger than 0 (zero), i.e., positive number.

The mixer 12 on the I side is configured to multiply the differential signals supplied from the amplifier 11 and the clock CPch1 signal to supply differential signals. The differential signals are supplied by the mixer 12 to the LPF circuit 13, and the voltage Vout is supplied from the LPF circuit 13 to the voltage Vout output terminal. The clock CPch1 signal has the same frequency and the same phase as those of the clock CPch0 signal supplied to the mixer 10. A mixer 14 is configured to multiply the differential signals supplied from the amplifier 11 and a clock CPch2 signal to supply differential signals.

The LPF circuit 13 on the I side has a frequency band responsive to the measured magnetic field as a passband, and is configured to remove switching noise of a chopping frequency generated by a non-ideal operation, for example, an actual delay of the device in chopper modulation/demodulation, and a second-order sideband wave of a magnetic field signal generated in principle, to thereby supply the signal corresponding to the measured magnetic field to the voltage Vout output terminal.

Figure 8:
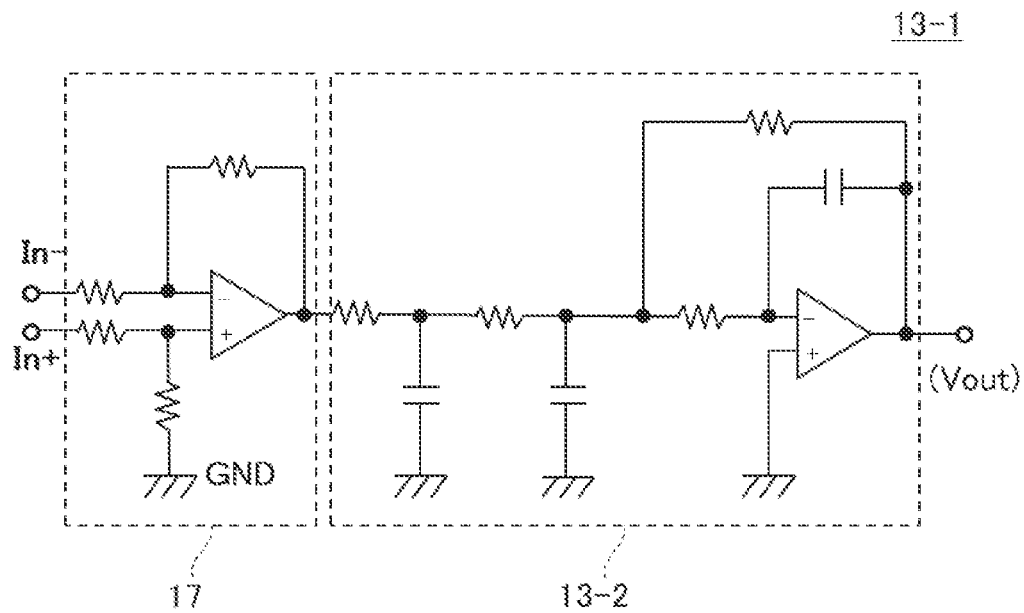
FIG. 8 is a circuit diagram for illustrating an example of a low-pass filter (hereinafter referred to as "LPF") in the first embodiment.
Figure 9:
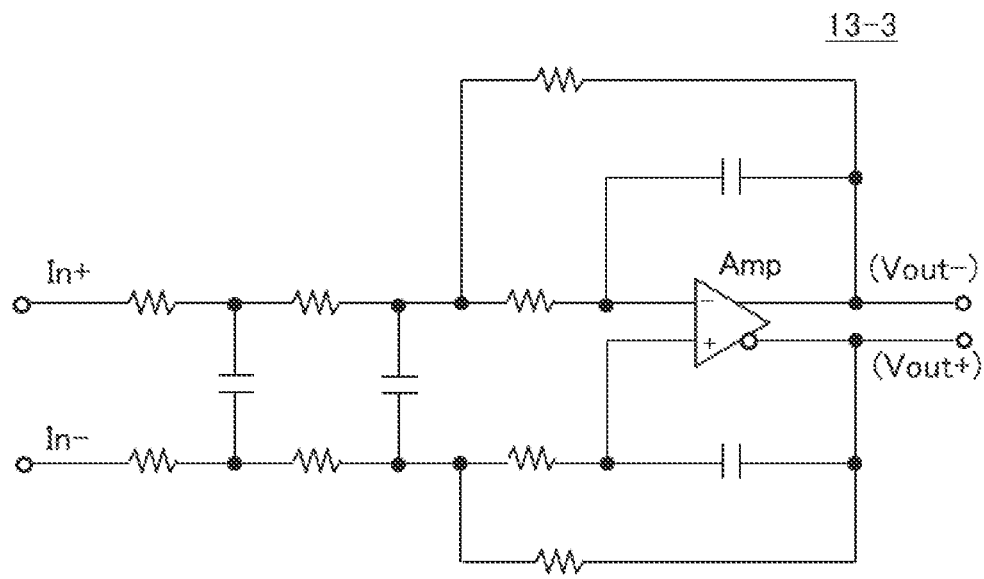
FIG. 9 is a circuit diagram for illustrating another example of the LPF in the first embodiment.

FIG. 8 shows a circuit example of the LPF circuit 13. An LPF circuit 13-1 in FIG. 8 includes a balanced/unbalanced conversion circuit 17 configured to convert the differential signals being balanced signals to an unbalanced signal, and a third-order active LPF 13-2. The balanced/unbalanced conversion circuit 17 and the third-order active LPF 13-2 have general circuit configurations, and description thereof is omitted. FIG. 9 shows another example of the third-order active LPF circuit 13. The example of the LPF circuit in FIG. 9 includes a third-order active LPF 13-3 configured to receive the differential signals and supply differential signals. This LPF circuit is selected in a case in which a differential signal output is selected as output signals. The third-order active LPF 13-3 has a general circuit configuration, and description thereof is omitted.

Referring to FIG. 4, the feedback circuit 4 is described. The feedback circuit 4 includes the mixer 14, an LPF circuit 15, and a gm amplifier 16. The mixer 14 is a passive analog multiplier having the same circuit configuration as that of the mixer 10. The gm amplifier 16 is a transconductance amplifier configured to supply an electric current that is proportional to a potential difference between input terminals.

The mixer 14 receives the outputs of the amplifier 11 and the clock CPch2 signal. Outputs of the mixer 14 are supplied to the LPF circuit 15. An output of the LPF circuit 15 is supplied as a voltage Vplt to the gm amplifier 16. The gm amplifier 16 is configured to convert the input voltage into the electric current, and supply the electric current. A flow of the signals from the mixer 14 to the LPF circuit 15 is called a "quadrature side", and is hereinafter referred to as "Q side."

The mixer 14 on the Q side is configured to multiply the differential signals supplied from the amplifier 11 and the clock CPch2 signal, and supply differential signals to the LPF circuit 15. The LPF circuit 15 is set to a very low cut-off frequency (for example, 10 Hz), and is configured to separate a DC component (referred to as "voltage Vplt") from the pilot signals supplied by the mixer 14, and supply the separated DC component to the gm amplifier 16.

The voltage Vplt supplied from the LPF circuit 15 on the Q side corresponds to the magnetic field applied from the reference magnetic field generating circuit 23 to the Hall element 21. The gm amplifier 16 is configured to compare the voltage Vplt with the reference voltage Vref supplied from the outside, and convert a result of the comparison into an electric current Igm for output.

Summarizing the operation of the feedback circuit 4, the feedback circuit 4 is configured to demodulate the pilot signals from the outputs of the amplifier 11 by the mixer 14, compare the DC component of the pilot signals with an external reference voltage by the gm amplifier 16, and convert the comparison result into the electric current for output.

Figure 10:
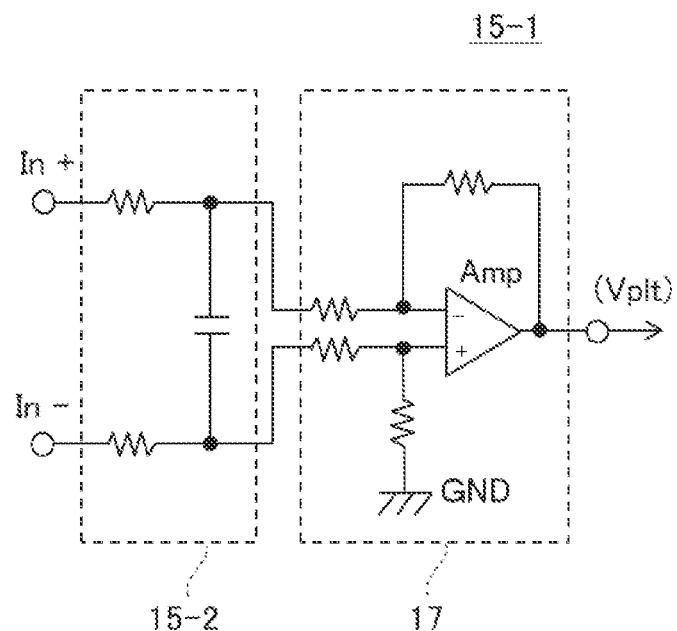
FIG. 10 is a circuit diagram for illustrating still another example of the LPF in the first embodiment.
Figure 11:
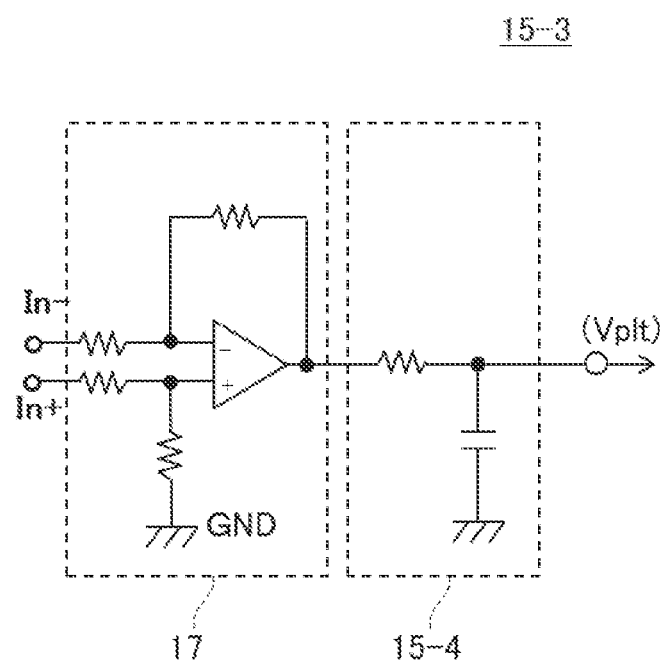
FIG. 11 is a circuit diagram for illustrating yet another example of the LPF in the first embodiment.
Figure 12:
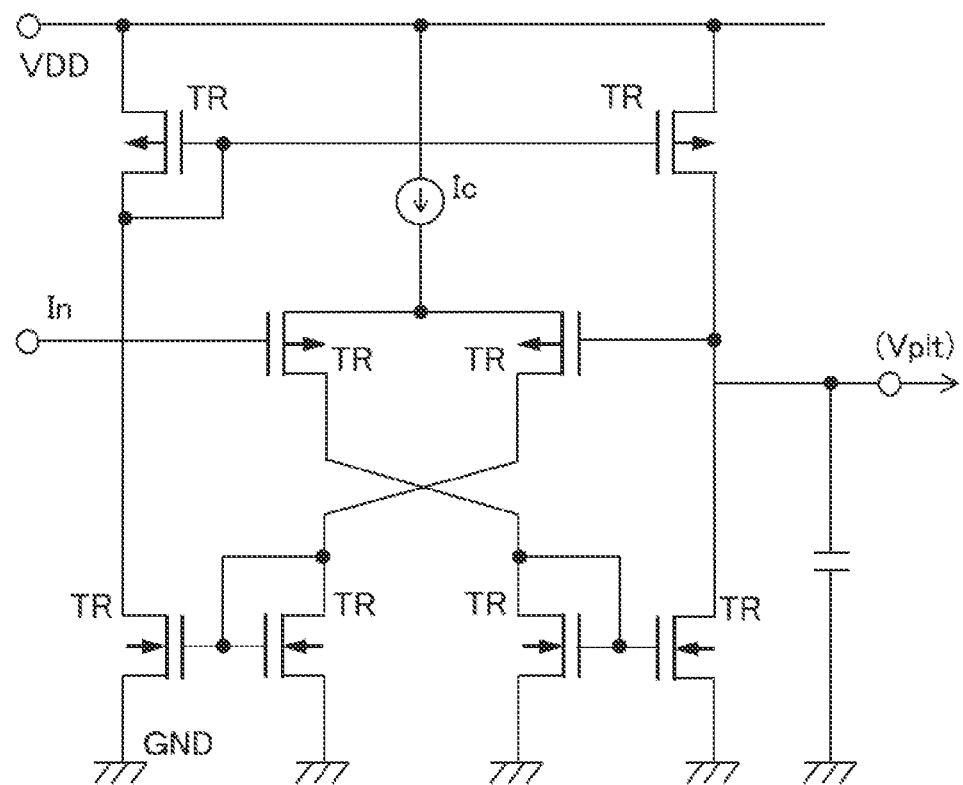
FIG. 12 is a circuit diagram for illustrating still yet another example of the LPF in the first embodiment.

FIG. 10 shows a circuit example of the LPF circuit 15. An LPF circuit 15-1 in FIG. 10 includes a balanced passive LPF 15-2 and the balanced/unbalanced conversion circuit 17. FIG. 11 shows another circuit example of the LPF circuit 15. An LPF circuit 15-3 shown in FIG. 11 includes the balanced/unbalanced conversion circuit 17 and an unbalanced passive LPF 15-4. FIG. 12 shows a circuit example of an unbalanced gmC filter type LPF 15-5 which can replace the unbalanced passive LPF 15-4. The balanced passive LPF 15-2, the unbalanced passive LPF 15-4, and the unbalanced gmC filter type LPF 15-5 have general circuit configurations, and description thereof is omitted.

Figure 13:
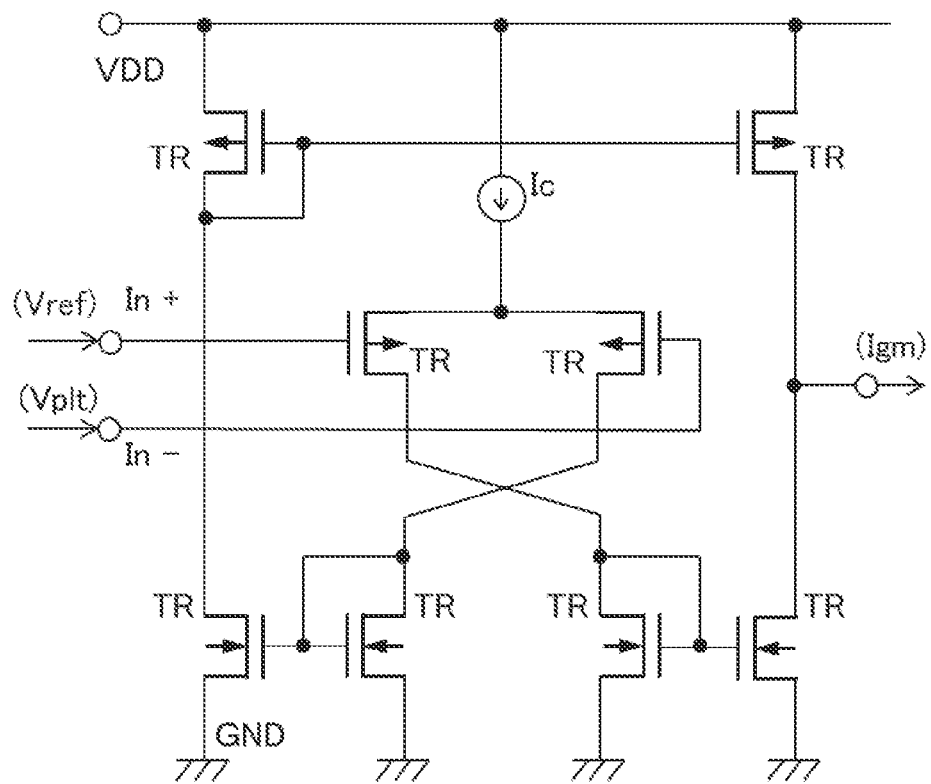
FIG. 13 is a circuit diagram for illustrating an example of a gm amplifier in the first embodiment.

FIG. 13 shows a circuit example of the gm amplifier 16. The gm amplifier 16 receives an external reference voltage Vref as an input to an In+ terminal, and the voltage Vplt supplied by the LPF circuit 15 as an input to an In− terminal, and supplies the electric current Igm that is proportional to a differential voltage between the In+ terminal and the In− terminal. The gm amplifier 16 has a general circuit configuration, and description thereof is omitted.

Figures 6, 7:
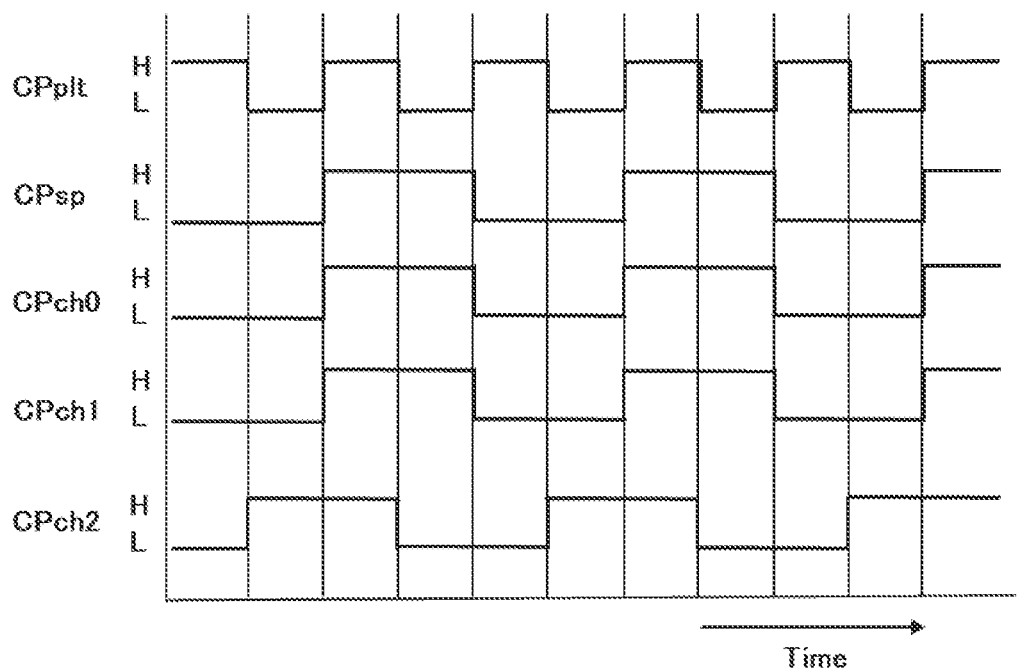
FIG. 6 is a timing chart for illustrating an example of clock signals in the first embodiment.
FIG. 7 is a table for showing an example of the clock signals in the first embodiment.
Figure 14:
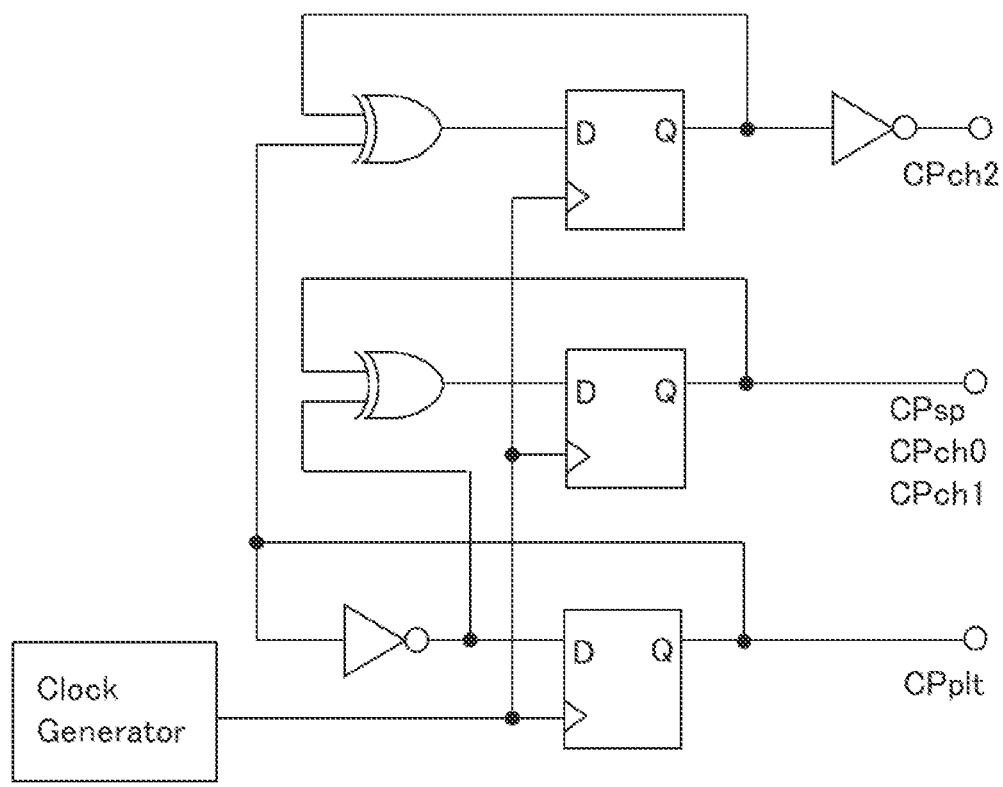
FIG. 14 is a diagram for illustrating an example of a clock generator in the first embodiment.

A timing chart of the clock CPplt signal, the clock CPsp signal, the clock CPch0 signal, the clock CPch1 signal, and the clock CPch2 signal is shown in FIG. 6, and frequency ratios and phases thereof are shown in FIG. 7. In FIG. 6, a vertical axis indicates a logical level, and a horizontal axis indicates time. The clock CPsp signal, the clock CPch0 signal, and the clock CPch1 signal have the same frequency and the same phase. The clock CPch2 signal has the same frequency as the clock CPsp signal, and is different in phase from the clock CPsp signal by +90°. The clock CPplt signal has a frequency that is twice the frequency of the clock CPsp signal. For example, the clock CPsp signal has a frequency of 2 MHz, and the clock CPplt signal has a frequency of 4 MHz. The five clock signals are clock signals for controlling corresponding switch circuits, respectively, and signal levels of the clock signals are levels with which the switch circuits can be controlled to correspond to the logical level. FIG. 14 shows a circuit example of a clock generation circuit 18 configured to generate the clock signals. The clock generation circuit 18 is a general circuit, and description thereof is omitted.

The electric current Igm supplied from the feedback circuit 4 is added to the electric current Ibias supplied from an external constant current source, and the sum is fed back as the electric current I to the magnetic sensor circuit 2. Because an output voltage of the Hall element 21 included in the magnetic sensor circuit 2 is proportional to the applied magnetic field and the electric current I, the sensitivity of the magnetic sensor circuit 2 can be adjusted by the electric current Igm.

Summarizing the operation in the first embodiment, the signals flow as follows. The magnetic sensor circuit 2 is configured to supply the signal obtained by superimposing the signal that is proportional to the electric current I and corresponds to the measured magnetic field with the pilot signals that are similarly proportional to the electric current I to the chopper modulator/demodulator circuit 3. The chopper modulator/demodulator circuit 3 is configured to chopper-modulate the supplied signal by the mixer 10, amplify the modulated signal by the amplifier 11, and demodulate the signal corresponding to the measured magnetic field by the mixer 12 and the LPF circuit 13 for output (I side). The feedback circuit 4 is configured to demodulate the DC component (voltage Vplt) of the pilot signals from the output of the amplifier 11 by the mixer 14 and the LPF circuit 15 (Q side), and convert a difference between the voltage Vplt and the reference voltage Vref into the electric current Igm by the gm amplifier 16 for output. The electric current Igm is added to the electric current Ibias to obtain the electric current I, and the electric current I is fed back to the magnetic sensor circuit 2.

Next, description is given of a mechanism in which the signal corresponding to the measured magnetic field (I side) and the pilot signals (Q side) which have been subjected to the chopper modulation/demodulation processing at the same time are separated.

Figure 15:
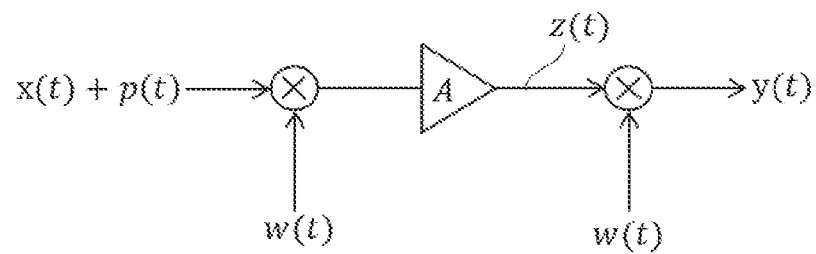
FIG. 15 is a block diagram for illustrating chopper modulation/demodulation operation on an I side in the first embodiment.

FIG. 15 is a block diagram for schematically illustrating a chopper modulation/demodulation operation in a main path. Here, A represents an amplification factor, x(t) represents a signal corresponding to the measured magnetic field, y(t) represents an output signal, z(t) represents an output signal of the amplifier 11, p(t) represents a pilot signal, w(t) represents a rectangular carrier wave and corresponds to the clock CPch0 signal and the clock CPch1 signal, and $w_c/2\pi$ represents a chopper modulation frequency. The signal x(t) corresponding to the measured magnetic field and the pilot signal p(t) are multiplied by the rectangular carrier wave w(t), are amplified to A times, and are multiplied again by the rectangular carrier wave w(t) to result in the output signal y(t).

$$z(t)=A\{x(t)+p(t)\}\cdot w(t) \tag{1}$$

$$y(t)=z(t)\cdot w(t) \tag{2}$$

$$y(t)=A\{x(t)+p(t)\}\cdot w(t)^2 \tag{3}$$

The rectangular wave w(t) is expressed by a Fourier series, and can be written as the following expression (4).

$$w(t) = \frac{4}{\pi}\left(\cos\omega_c t - \frac{1}{3}\cos 3\omega_c t + \frac{1}{5}\cos 5\omega_c t - \frac{1}{7}\cos 7\omega_c t + \frac{1}{9}\cos 9\omega_c t - \frac{1}{11}\cos 11\omega_c t + \ldots\right) \tag{4}$$

Calculating w(t)^2, i.e., square of w(t) results in the following expression (5), and the expression (5) is simplified using product and sum formulas of trigonometric functions as the following expression (6).

$$w(t)^2 = \frac{16}{\pi^2}\Big(\cos\omega_c t \cos\omega_c t - \frac{1}{3}\cos\omega_c t\cos 3\omega_c t + \frac{1}{5}\cos\omega_c t\cos 5\omega_c t - \qquad(5)$$
$$\frac{1}{7}\cos\omega_c t\cos 7\omega_c t + \frac{1}{9}\cos\omega_c t\cos 9\omega_c t - \ldots -$$
$$\frac{1}{3}\cos 3\omega_c t\cos\omega_c t + \frac{1}{9}\cos 3\omega_c t\cos 3\omega_c t - \frac{1}{15}\cos 3\omega_c t\cos 5\omega_c t +$$
$$\frac{1}{21}\cos 3\omega_c t\cos 7\omega_c t - \frac{1}{27}\cos 3\omega_c t\cos 9\omega_c t - \ldots +$$
$$\frac{1}{5}\cos 5\omega_c t\cos\omega_c t - \frac{1}{15}\cos 5\omega_c t\cos 3\omega_c t + \frac{1}{25}\cos 5\omega_c t\cos 5\omega_c t -$$
$$\frac{1}{35}\cos 5\omega_c t\cos 7\omega_c t + \frac{1}{45}\cos 5\omega_c t\cos 9\omega_c t - \ldots -$$
$$\frac{1}{7}\cos 7\omega_c t\cos\omega_c t + \frac{1}{21}\cos 7\omega_c t\cos 3\omega_c t - \frac{1}{35}\cos 7\omega_c t\cos 5\omega_c t +$$
$$\frac{1}{49}\cos 7\omega_c t\cos 7\omega_c t - \frac{1}{63}\cos 7\omega_c t\cos 9\omega_c t - \ldots +$$
$$\frac{1}{9}\cos 9\omega_c t\cos\omega_c t - \frac{1}{27}\cos 9\omega_c t\cos 3\omega_c t + \frac{1}{45}\cos 9\omega_c t\cos 5\omega_c t -$$
$$\frac{1}{63}\cos 9\omega_c t\cos 7\omega_c t + \frac{1}{81}\cos 9\omega_c t\cos 9\omega_c t - \ldots + + \ldots\Big)$$

$$w(t)^2 = \frac{16}{\pi^2}\cdot\frac{1}{2}\Big(\cos 2\omega_c t + 1 - \frac{2}{3}\cos 4\omega_c t - \frac{2}{3}\cos 2\omega_c t + \qquad(6)$$
$$\frac{1}{9}\cos 6\omega_c t + \frac{1}{9} + \frac{2}{5}\cos 6\omega_c t + \frac{2}{5}\cos 4\omega_c t - \frac{2}{15}\cos 8\omega_c t -$$
$$\frac{2}{15}\cos 2\omega_c t + \frac{1}{25}\cos 10\omega_c t + \frac{1}{25} - \frac{2}{7}\cos 8\omega_c t - \frac{2}{7}\cos 6\omega_c t +$$
$$\frac{2}{21}\cos 10\omega_c t + \frac{2}{21}\cos 4\omega_c t - \frac{2}{35}\cos 12\omega_c t - \frac{2}{35}\cos 2\omega_c t +$$
$$\frac{1}{49}\cos 14\omega_c t + \frac{1}{49} + \frac{2}{9}\cos 10\omega_c t + \frac{2}{9}\cos 8\omega_c t -$$
$$\frac{2}{27}\cos 12\omega_c t - \frac{2}{27}\cos 6\omega_c t + \frac{2}{45}\cos 14\omega_c t + \frac{2}{45}\cos 4\omega_c t -$$
$$\frac{2}{63}\cos 16\omega_c t - \frac{2}{63}\cos 2\omega_c t + \frac{1}{81}\cos 18\omega_c t + \frac{1}{81} + + + \ldots\Big)$$

Organizing the expression (6) for each term results in the following expression (7).

$$w(t)^2 = \frac{8}{\pi^2}\Big\{\cos 2\omega_c t\Big(1 - \frac{2}{3} - \frac{2}{15} - \frac{2}{35} - \ldots - \frac{2}{(2n-1)(2n+1)} - \ldots\Big) + \qquad(7)$$
$$\cos 4\omega_c t\Big(-\frac{2}{3} + \frac{2}{5} + \frac{2}{21} + \frac{2}{45} + \ldots + \frac{2}{(2n-1)(2n+3)} + \ldots\Big) +$$
$$\cos 6\omega_c t\Big(\frac{1}{9} + \frac{2}{5} - \frac{2}{7} - \frac{2}{27} - \frac{2}{55} - \ldots - \frac{2}{(2n-1)(2n+5)} - \ldots\Big) +$$
$$\cos 8\omega_c t\Big(-\frac{2}{15} - \frac{2}{7} + \frac{2}{9} + \frac{2}{33} + \frac{2}{65} +$$
$$\ldots + \frac{2}{(2n-1)(2n+7)} + \ldots\Big) + + + + \cos$$
$$m\omega_c t\cdot\Big(\ldots + \frac{2}{(2n-1)(2n+2m-1)} + \ldots\Big) + + + +$$
$$\Big(1 + \frac{1}{9} + \frac{1}{25} + \frac{1}{49} + \frac{1}{81} + \ldots\Big)\Big\}$$

In the expression (7), assuming that n→∞ and m→∞, the following expressions (8) and (9) are obtained.

$$w(t)^2 = \frac{8}{\pi^2}\Big\{\cos 2\omega_c t\cdot 0 + \cos 4\omega_c t\cdot 0 + \cos 6\omega_c t\cdot 0 + \qquad(8)$$
$$\cos 8\omega_c t\cdot 0 + + + + \cos m\omega_c t\cdot 0 + + + + \Big(\sum_{k=1}^{\infty}\frac{1}{(2k-1)^2}\Big)\Big\}$$

$$w(t)^2 = \frac{8}{\pi^2}\cdot\Big(\sum_{k=1}^{\infty}\frac{1}{(2k-1)^2}\Big) \qquad(9)$$
$$= \frac{8}{\pi^2}\cdot\frac{\pi^2}{8} = 1$$

Based on the expressions (8) and (9), the output signal y(t) is obtained by linearly amplifying x(t)+p(t) as in the following expression (10).

$$y(t)=A\{x(t)+p(t)\} \qquad(10)$$

Figure 16:
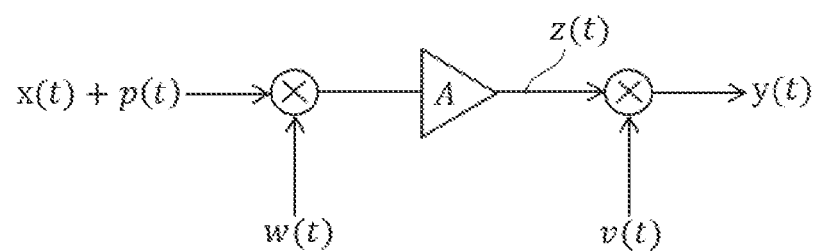
FIG. 16 is a block diagram for illustrating chopper modulation/demodulation operation on a Q side in the first embodiment.

Because the pilot signal p(t) is outside the signal band corresponding to the measured magnetic field, the signal x(t) may thereafter be discriminated by the LPF. Similarly, FIG. 16 is a block diagram for schematically illustrating a chopper modulation/demodulation operation on a negative feedback side. Here, v(t) represents a rectangular carrier wave (+90°), and corresponds to the clock CPch2 signal. The input/output relationship is described as follows.

$$z(t)=A\{x(t)+p(t)\}\cdot w(t) \qquad(11)$$

$$y(t)=z(t)\cdot v(t) \qquad(12)$$

$$y(t)=A\{x(t)+p(t)\}\cdot w(t)\cdot v(t) \qquad(13)$$

Further, an LO input for demodulation supplied to the mixer 14 is a rectangular wave v(t) that is advanced by 90° with respect to w(t), and is expressed by the following (15).

$$w(t) = \qquad(14)$$
$$\frac{4}{\pi}\Big(\cos\omega_c t - \frac{1}{3}\cos 3\omega_c t + \frac{1}{5}\cos 5\omega_c t - \frac{1}{7}\cos 7\omega_c t + \frac{1}{9}\cos 9\omega_c t - \ldots\Big)$$

$$v(t) = \frac{4}{\pi}\Big(\sin\omega_c t + \frac{1}{3}\sin 3\omega_c t + \frac{1}{5}\sin 5\omega_c t + \frac{1}{7}\sin 7\omega_c t + \frac{1}{9}\cos 9\omega_c t - \ldots\Big) \qquad(15)$$

Here, calculating w(t)·v(t) results in the following expression (16), and the expression (16) is simplified as the following expression (17).

$$w(t)\cdot v(t) = \frac{16}{\pi^2}\Big(\sin\omega_c t\cos\omega_c t - \frac{1}{3}\sin\omega_c t\cos 3\omega_c t + \qquad(16)$$
$$\frac{1}{5}\sin\omega_c t\cos 5\omega_c t - \frac{1}{7}\sin\omega_c t\cos 7\omega_c t + \frac{1}{9}\sin\omega_c t\cos 9\omega_c t - \ldots +$$
$$\frac{1}{3}\sin 3\omega_c t\cos\omega_c t - \frac{1}{9}\sin 3\omega_c t\cos 3\omega_c t + \frac{1}{15}\sin 3\omega_c t\cos 5\omega_c t -$$
$$\frac{1}{21}\sin 3\omega_c t\cos 7\omega_c t + \frac{1}{27}\sin 3\omega_c t\cos 9\omega_c t - \ldots +$$
$$\frac{1}{5}\sin 5\omega_c t\cos\omega_c t - \frac{1}{15}\sin 5\omega_c t\cos 3\omega_c t + \frac{1}{25}\sin 5\omega_c t\cos 5\omega_c t -$$
$$\frac{1}{35}\sin 5\omega_c t\cos 7\omega_c t + \frac{1}{45}\sin 5\omega_c t\cos 9\omega_c t - \ldots +$$
$$\frac{1}{7}\sin 7\omega_c t\cos\omega_c t - \frac{1}{21}\sin 7\omega_c t\cos 3\omega_c t + \frac{1}{35}\sin 7\omega_c t\cos 5\omega_c t -$$
$$\frac{1}{49}\sin 7\omega_c t\cos 7\omega_c t + \frac{1}{63}\sin 7\omega_c t\cos 9\omega_c t - \ldots +$$
$$\frac{1}{9}\sin 9\omega_c t\cos\omega_c t - \frac{1}{27}\sin 9\omega_c t\cos 3\omega_c t + \frac{1}{45}\sin 9\omega_c t\cos 5\omega_c t -$$
$$\frac{1}{63}\sin 9\omega_2 t\cos 7\omega_c t + \frac{1}{81}\sin 9\omega_c t\cos 9\omega_c t - \ldots + + \ldots\Big)$$

-continued $$w(t) \cdot v(t) = \qquad (17)$$
$$\frac{16}{\pi^2}\Big(\frac{1}{2}\sin 2\omega_c t + \frac{1}{3}\sin 2\omega_c t - \frac{1}{18}\sin 6\omega_c t + \frac{1}{5}\sin 6\omega_c t - \frac{1}{15}\sin 2\omega_c t +$$
$$\frac{1}{50}\sin 10\omega_c t + \frac{1}{7}\sin 6\omega_c t - \frac{1}{21}\sin 10\omega_c t +$$
$$\frac{1}{35}\sin 2\omega_c t - \frac{1}{98}\sin 14\omega_c t + \frac{1}{9}\sin 10\omega_c t - \frac{1}{27}\sin 6\omega_c t +$$
$$\frac{1}{45}\sin 14\omega_c t - \frac{1}{63}\sin 2\omega_c t + \frac{1}{162}\sin 18\omega_c t + + \ldots\Big)$$

The expression (17) is aligned for each term and complemented with 0 to result in the following expression (18).

$$w(t) \cdot v(t) = \qquad (18)$$
$$\frac{16}{\pi^2}\Big(\frac{1}{1}\sin 2\omega_c t + \frac{0}{3}\sin 6\omega_c t + \frac{0}{5}\sin 10\omega_c t + \frac{0}{7}\sin 14\omega_c + \frac{0}{9}\sin 18\omega_c t +$$
$$\ldots + \frac{1}{3}\sin 2\omega_c t - \frac{1}{18}\sin 6\omega_c t + \frac{0}{15}\sin 10\omega_c t +$$
$$\frac{0}{21}\sin 14\omega_c t + \frac{0}{27}\sin 18\omega_c t + \ldots - \frac{1}{15}\sin 2\omega_c t + \frac{1}{5}\sin 6\omega_c t +$$
$$\frac{1}{50}\sin 10\omega_c t + \frac{0}{35}\sin 14\omega_c t + \frac{0}{45}\sin 18\omega_c t + \ldots +$$
$$\frac{1}{35}\sin 2\omega_c t + \frac{1}{7}\sin 6\omega_c t - \frac{1}{21}\sin 10\omega_c t - \frac{1}{98}\sin 14\omega_c t +$$
$$\frac{0}{63}\sin 18\omega_c t + \ldots - \frac{1}{63}\sin 2\omega_c t - \frac{1}{27}\sin 6\omega_c t +$$
$$\frac{1}{9}\sin 10\omega_c t + \frac{1}{45}\sin 14\omega_c t + \frac{1}{162}\sin 18\omega_c t + \ldots + + \ldots\Big)$$

Factors in the expression (18) are rewritten as Leibniz series and one odd-number-th thereof for each term to obtain the following expression (19).

$$w(t) \cdot v(t) = \qquad (19)$$
$$\frac{16}{\pi^2}\Big(\frac{1}{1}\sin 2\omega_c t + \frac{1}{3}\sin 6\omega_c t + \frac{1}{5}\sin 10\omega_c t + \frac{1}{7}\sin 14\omega_c t + \frac{1}{9}\sin 18\omega_c t +$$
$$\ldots - \frac{1}{3}\sin 2\omega_c t - \frac{1}{9}\sin 6\omega_c t - \frac{1}{15}\sin 10\omega_c t - \frac{1}{21}\sin 14\omega_c t -$$
$$\frac{1}{27}\sin 18\omega_c t - \ldots + \frac{1}{5}\sin 2\omega_c t + \frac{1}{15}\sin 6\omega_c t +$$
$$\frac{1}{25}\sin 10\omega_c t + \frac{1}{35}\sin 14\omega_c t + \frac{1}{45}\sin 18\omega_c t + \ldots -$$
$$\frac{1}{7}\sin 2\omega_c t - \frac{1}{21}\sin 6\omega_c t - \frac{1}{35}\sin 10\omega_c t - \frac{1}{49}\sin 14\omega_c t -$$
$$\frac{1}{63}\sin 18\omega_c t - \ldots + \frac{1}{9}\sin 2\omega_c t + \frac{1}{27}\sin 6\omega_c t +$$
$$\frac{1}{45}\sin 10\omega_c t + \frac{1}{63}\sin 14\omega_c t + \frac{1}{81}\sin 18\omega_c t + \ldots + + \ldots\Big)$$

Because the factors in the expressions (18) and (19) are accumulated downward for each term to converge the error to 0, the expressions (18) and (19) can be regarded as being equivalent. Accordingly, the expression (19) is factorized to obtain the following expression (20).

$$w(t) \cdot v(t) = \qquad (20)$$
$$\frac{16}{\pi^2}\Big(\sin 2\omega_c t + \frac{1}{3}\sin 6\omega_c t + \frac{1}{5}\sin 10\omega_c t + \frac{1}{7}\sin 14\omega_c t + \frac{1}{9}\sin 18\omega_c t +$$

-continued $$\ldots\Big) \cdot \Big(1 - \frac{1}{3} + \frac{1}{5} - \frac{1}{7} + \frac{1}{9} - \ldots\Big) =$$
$$\frac{16}{\pi^2}\Big(\sin 2\omega_c t + \frac{1}{3}\sin 6\omega_c t + \frac{1}{5}\sin 10\omega_c t + \frac{1}{7}\sin 14\omega_c t +$$
$$\frac{1}{9}\sin 18\omega_c t + \ldots\Big) \cdot \frac{\pi}{4} =$$
$$\frac{4}{\pi}\Big(\sin 2\omega_c t + \frac{1}{3}\sin 6\omega_c t + \frac{1}{5}\sin 10\omega_c t + \frac{1}{7}\sin 14\omega_c t +$$
$$\frac{1}{9}\sin 18\omega_c t + \ldots\Big) = v(2t)$$

In other words, the rectangular waves w(t) and v(t) are multiplied to result in v(2t) which is obtained by compressing the time axis t to one half the original length. Because the pilot signals p(t) are originally assumed to be a rectangular wave having twice a chopper modulation frequency that is generated by the reference magnetic field generating circuit 23 and is advanced by 90°, the following expressions can be established with a Hall element sensitivity factor being represented by B.

$$p(t) = Bv(2t) \qquad (21)$$

$$p(t) \cdot v(2t) = Bv(2t)^2 \qquad (22)$$

Although the process is omitted, the right side of the expression (22) is calculated as in the case of w(t)^2 to result in 1.

$$v(2t)^2 = 1 \qquad (23)$$

Consequently, as in the right-most side of the expression (24), a sideband wave obtained by upconverting x(t) that has been linearly amplified to A times to twice the chopper frequency and the DC signal multiplied by AB appear as the output signal y(t).

$$y(t) = A\{x(t) + p(t)\} \cdot v(2t) = Ax(t) \cdot v(2t) + Ap(t) \cdot v(2t) = Ax(t) \cdot v(2t) + AB \qquad (24)$$

The above discussion is developed to a frequency region. Fourier transform of each time signal is expressed as follows.

$$\mathcal{F}\{x(t)\} = X(\omega) \qquad (25)$$

$$\mathcal{F}\{y(t)\} = Y(\omega) \qquad (26)$$

$$\mathcal{F}\{z(t)\} = Z(\omega) \qquad (27)$$

$$\mathcal{F}\{p(t)\} = P(\omega) \qquad (28)$$

Further, because the following expressions (29) and (30) can be written using a delta function, the following expressions (31) and (32) can be obtained from the expressions (14) and (15).

$$\mathcal{F}\{\cos n\omega_c t\} = \pi\delta(\omega - n\omega_c) + \pi\delta(\omega + n\omega_c) \qquad (29)$$

$$\mathcal{F}\{\sin n\omega_c t\} = j\pi\delta(\omega - n\omega_c) + j\pi\delta(\omega + n\omega_c) \qquad (30)$$

$$\mathcal{F}\{w(t)\} = W(\omega) = \qquad (31)$$
$$\pi\Big\{\delta(\omega - \omega_c) - \frac{1}{3}\delta(\omega - 3\omega_c) + \frac{1}{5}\delta(\omega - 5\omega_c) - \frac{1}{7}\delta(\omega - 7\omega_c) +$$
$$\ldots + \delta(\omega + \omega_c) - \frac{1}{3}\delta(\omega + 3\omega_c) +$$
$$\frac{1}{5}\delta(\omega + 5\omega_c) - \frac{1}{7}\delta(\omega + 7\omega_c) + \ldots\Big\}$$

-continued $$\mathcal{F}\{v(t)\} = V(\omega) = \quad (32)$$
$$-j\pi\left\{\delta(\omega-\omega_c) + \frac{1}{3}\delta(\omega-3\omega_c) + \frac{1}{5}\delta(\omega-5\omega_c) + \frac{1}{7}\delta(\omega-7\omega_c) + \right.$$
$$\ldots - \delta(\omega+\omega_c) - \frac{1}{3}\delta(\omega+3\omega_c) -$$
$$\left. \frac{1}{5}\delta(\omega+5\omega_c) - \frac{1}{7}\delta(\omega+7\omega_c) - \ldots \right\}$$

Figure 17:
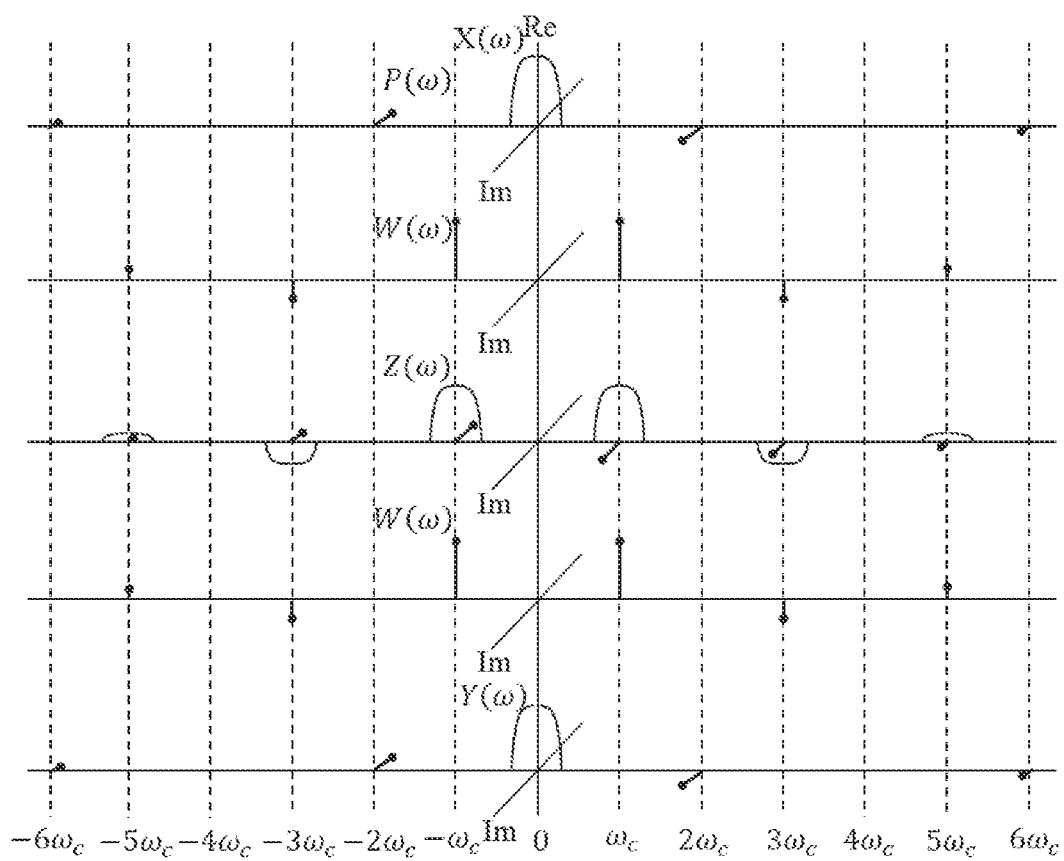
FIG. 17 is a graph for showing behavior in a frequency region on the I side in the first embodiment.
Figure 18:
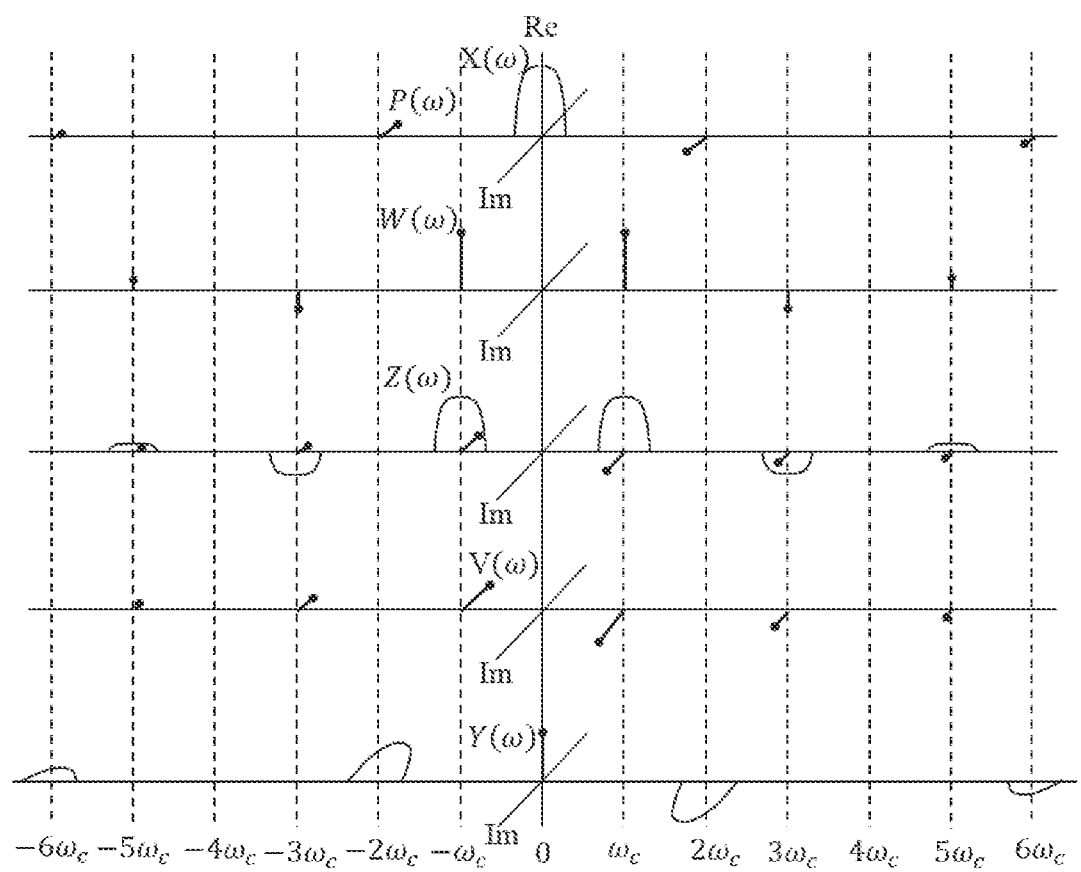
FIG. 18 is a graph for showing behavior in a frequency region on the Q side in the first embodiment.

In FIG. 17 and FIG. 18, an X axis indicates an angular frequency, a Y axis indicates an imaginary number, and a Z axis indicates a real number and is superimposed. FIG. 17 shows a signal processing process in the main path on the I side, and FIG. 18 shows a signal processing process of a feedback signal on the Q side. A spectrum of the signal corresponding to the measured magnetic field is represented by $X(\omega)$, and is assumed to exist only on a positive side in a cosine phase. Because a spectrum sequence $P(\omega)$ of the pilot signals p(t) is a rectangular wave having twice a chopper frequency cc and a sine phase advanced by 90°, $2\omega c$ is decomposed into a fundamental wave and odd-number-th order harmonics thereof, and is arranged on the Y axis. Because a chopper-modulated carrier wave $W(\omega)$ is in the cosine phase, and has a spectrum sequence of the expression (31), in the chopper modulation, $X(\omega)+P(\omega)$ are independently frequency converted in the same spectrum sequence and added to be multiplied by A to obtain a chopper-modulated wave $Z(\omega)$. The above-mentioned process is common for the I side and the Q side.

For chopper demodulation on the I side in FIG. 17, because a chopper-demodulated carrier wave is $W(\omega)$ which is the same as in the modulation, frequency convolution is executed as in the frequency conversion during the modulation to estimate a spectrum of $Y(\omega)$, for example. Originally in the time domain, because the output signal y(t) finally results in the expression (10) which is irrelevant to a chopper-modulated carrier wave w(t), the following expression (33) is obtained together with the following expression (34).

$$p(t)=Bv(2t) \quad (33)$$

$$y(t)=A\{x(t)+Bv(2t)\} \quad (34)$$

Accordingly, the expression (34) is Fourier-transformed to result in the following expression (35), and matches the illustrated $Y(\omega)$.

$$Y(\omega) = A\left\{X(\omega) + BV\left(\frac{\omega}{2}\right)\right\} \quad (35)$$

Because $V(\omega)/2$ in the expression (35) is obtained by extending a frequency axis of $V(\omega)$ to twice the original length, $V(\omega)/2$ can be separated easily from the $X(\omega)$ band. In other words, it can be understood that, on the I side, an LPF of a required band may be added to eliminate the effect of the pilot signals p(t) superimposed in advance. For the chopper demodulation on the Q side in FIG. 18, because the chopper-demodulated carrier wave is $V(\omega)$ in the sine phase, $Y(\omega)$ can be estimated by similar convolution. Similarly, the expression (24) is Fourier-transformed to obtain the following expression (36).

$$Y(\omega) = \mathcal{F}\{y(t)\} = A\left\{X(\omega)*V\left(\frac{\omega}{2}\right)\right\} + 2AB\pi\delta(\omega) \quad (36)$$

Thus, a DC signal derived from the pilot signals that have been subjected to the same chopper modulation signal processing as a measured-magnetic-field-responsive signal appears on the Q side.

It can be understood from the above description that the Q-side node, that is, the voltage Vplt in FIG. 1 can be used as a monitor for magnetic field sensitivity that depends on electrical characteristics in the main path, that is, from the magnetic sensor circuit 2 to the mixer 10 and the amplifier 11 in FIG. 1. Further, as long as the mixer 12 and the mixer 14 match in characteristics, and characteristics of the LPF circuit 13 and the LPF circuit 15 are sufficiently predictable, the voltage Vplt can be used as a monitor for magnetic field sensitivity that depends on electrical characteristics to the output of the voltage Vout.

It is desired that an operating speed of the amplifier 11 be significantly higher than a chopper demodulation frequency, but under the effect of a phase lag, a delay circuit configured to generate an equivalent delay with multi-stage connection of inverters may be inserted in a chopper demodulation clock path at the LO input to the mixer 12 and the mixer 14. Further, in a case in which a spinning offset of the Hall element 21 of the device main body is larger than expected, or in a case in which a DC offset of the amplifier 11 is unignorable, a high-pass filter HPF may be inserted before and after the amplifier 11.

Next, description is given of a control method using the monitor for the magnetic field sensitivity, that is, the voltage Vplt on the Q side in FIG. 1. From the above description, because the effect of the mixers on a baseband voltage of the voltage Vout and the voltage Vplt is eliminated, the magnetic sensor device 1 of FIG. 1 can be regarded as a linear system. Here, an output of the reference magnetic field generating circuit 23 is represented by B (T), magnetic field sensitivity of the Hall element 21 is represented by S (V/AT), the LPF circuit 15 is of a first order and has a transfer function of $1/(s\tau 1+1)$, and a transconductor of the gm amplifier 16 is represented by C(s) (NV). A loop transfer function G(s) from the reference voltage Vref to the voltage Vplt of a loop including the feedback circuit 4 is expressed as the following expression (37).

$$G(s) = ABS\frac{1}{(s\tau_1+1)}C(s) \quad (37)$$

$$C(s) = \frac{C(s\tau_a+1)(s\tau_b+1)\ldots}{(s\tau_2+1)(s\tau_3+1)(s\tau_4+1)\ldots} \quad (38)$$

A transfer function of the transconductor C(s) of the gm amplifier 16 is expressed as the expression (38). Assuming that a first order in which, of a plurality of poles, other poles than a pole $-1/\tau 2$ closest to 0 are ignorable has dominant characteristics, the expression (37) is rewritten as the following expression (39).

$$G(s) = \frac{ABCS}{(s\tau_1+1)(s\tau_2+1)} \quad (39)$$

Figure 19:
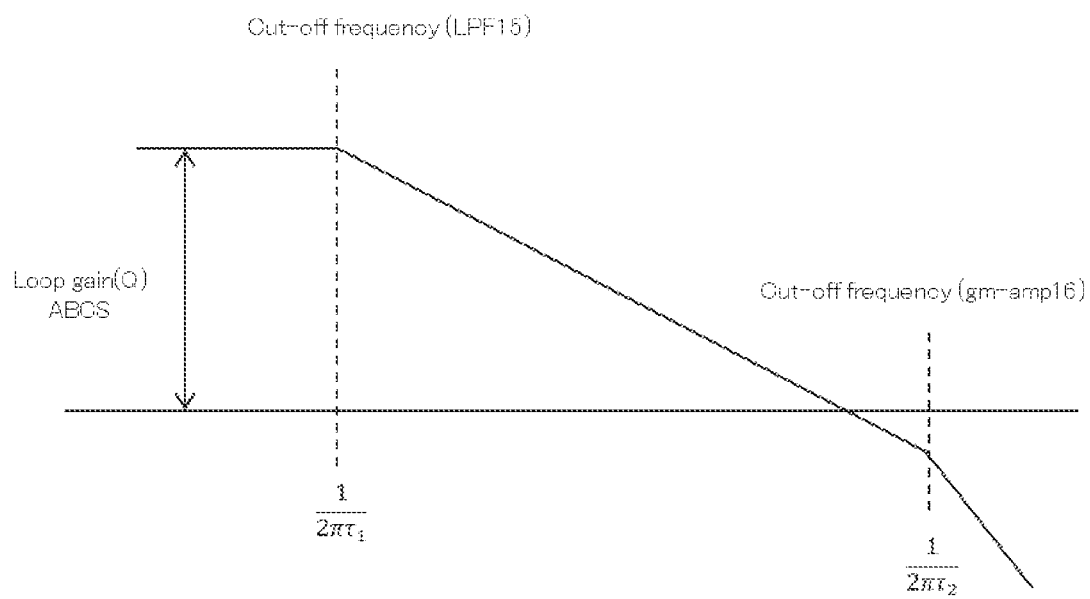
FIG. 19 is a bode diagram of a control loop in the first embodiment.

A bode diagram depicted based on the above expressions is shown in FIG. 19.

A stable condition for the system given by the expression (39) is expressed by the following expression (40).

$$ABCS < \frac{\tau_1}{\tau_2} \quad (40)$$

A design parameter is normally τ1, where τ1>>τ2, and ABCS may be determined such that an unnecessary second-order sideband wave can be suppressed.

In this example, the LPF circuit 15 is of the first order with a compromised control speed for simplicity, but as long as a high degree of stability can be ensured, the present invention is not limited to the first order.

In accordance with the magnetic sensor device of the first embodiment, the voltage Vplt can be controlled with the reference voltage Vref as the control target, and at the same time, the voltage Vout at the output can be controlled.

Figure 20:
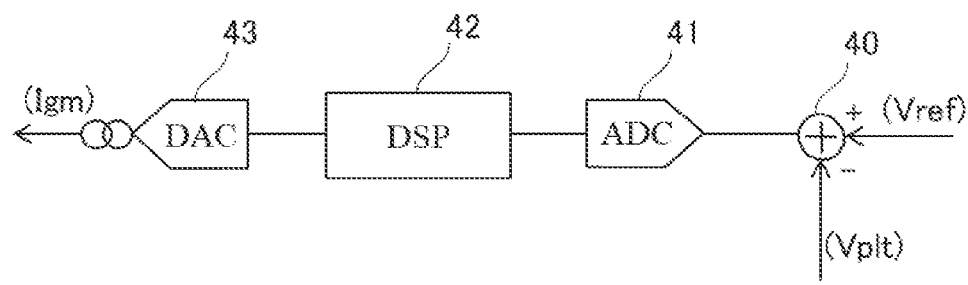
FIG. 20 is a block diagram for illustrating an example of a digital circuit configuration of the feedback circuit in the first embodiment.

Further, with the use of digital processing, processing can be performed at a higher speed than in the above-mentioned control. In other words, the gm amplifier 16 can be replaced as in FIG. 20, for example. In FIG. 20, the gm amplifier 16 is replaced by a subtractor 40, an AD converter (ADC) 41, a digital signal processor (DSP) 42, and a current output DA converter (DAC) 43. The subtractor 40 and the ADC 41 may be combined as a simple 1-bit latch comparator, but is required to have an operating speed that is 4 times a chopper modulation frequency cc or more. The DSP 42 is a band rejection filter (BRF) configured to reject a second-order sideband superimposed on the chopper-demodulated signal, and the DAC 43 is a current output DAC having a relatively high resolution.

As can be understood from FIG. 18, because the second-order sideband wave of the measured-magnetic-field-responsive signal is a dominant disturbing wave for the voltage Vplt, the DSP 42 may strongly attenuate the second-order sideband wave to reduce the load on the LPF circuit 15, and increase the cut-off frequency, that is, reduce τ1 to widen a bandwidth of a closed loop. In particular, in a case in which hunting is obtrusive because of coarse resolution of the DAC 43, it is one of stabilizing means to set a blind condition to stop the operation.

Second Embodiment

Figure 21:
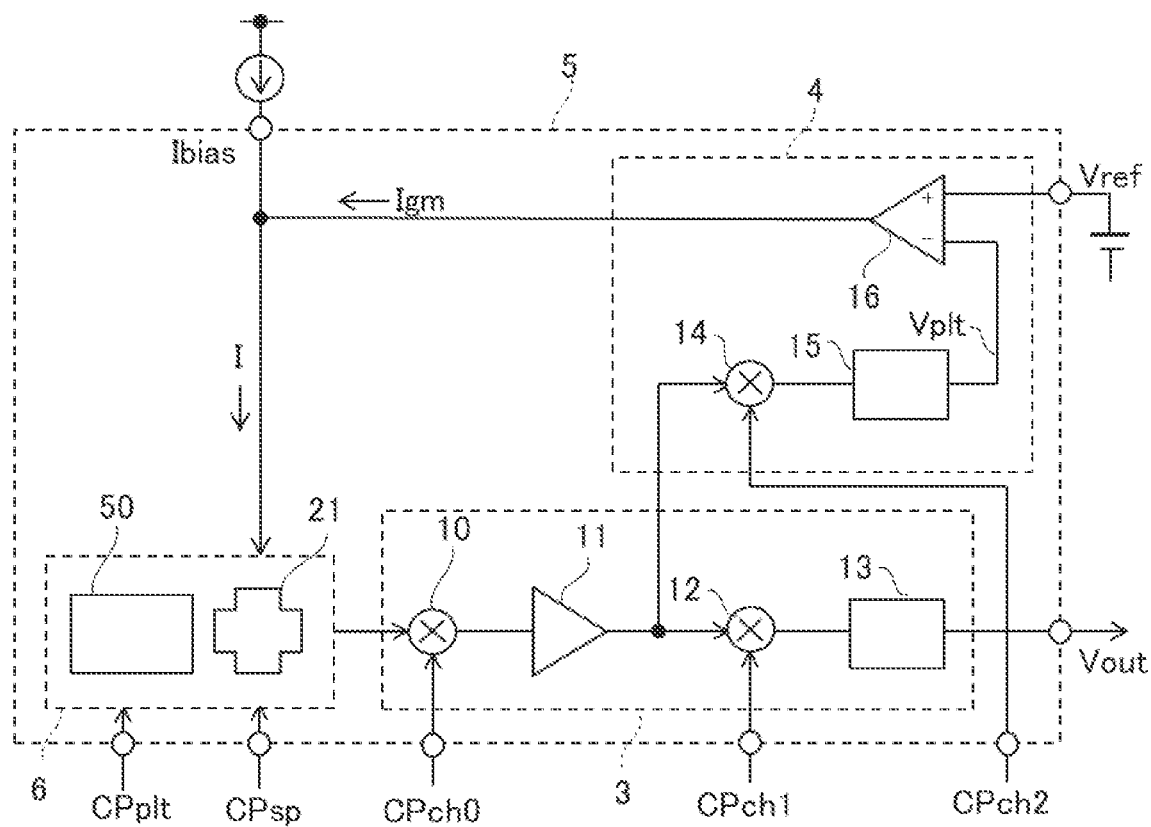
FIG. 21 is a block diagram for illustrating an example of a magnetic sensor device according to a second embodiment of the present invention.

Referring to FIG. 21, a magnetic sensor device 5 according to a second embodiment of the present invention is described. The magnetic sensor device 5 according to the second embodiment includes a magnetic sensor circuit 6, the chopper modulator/demodulator circuit 3, the feedback circuit 4, the current Ibias input terminal, the reference voltage Vref input terminal, the five clock input terminals, and the voltage Vout output terminal. The second embodiment is different from the first embodiment in that the magnetic sensor circuit 2 in FIG. 1 is replaced by the magnetic sensor circuit 6. Like circuits as those in the first embodiment are denoted by like numerals, and description thereof is omitted.

Figure 22:
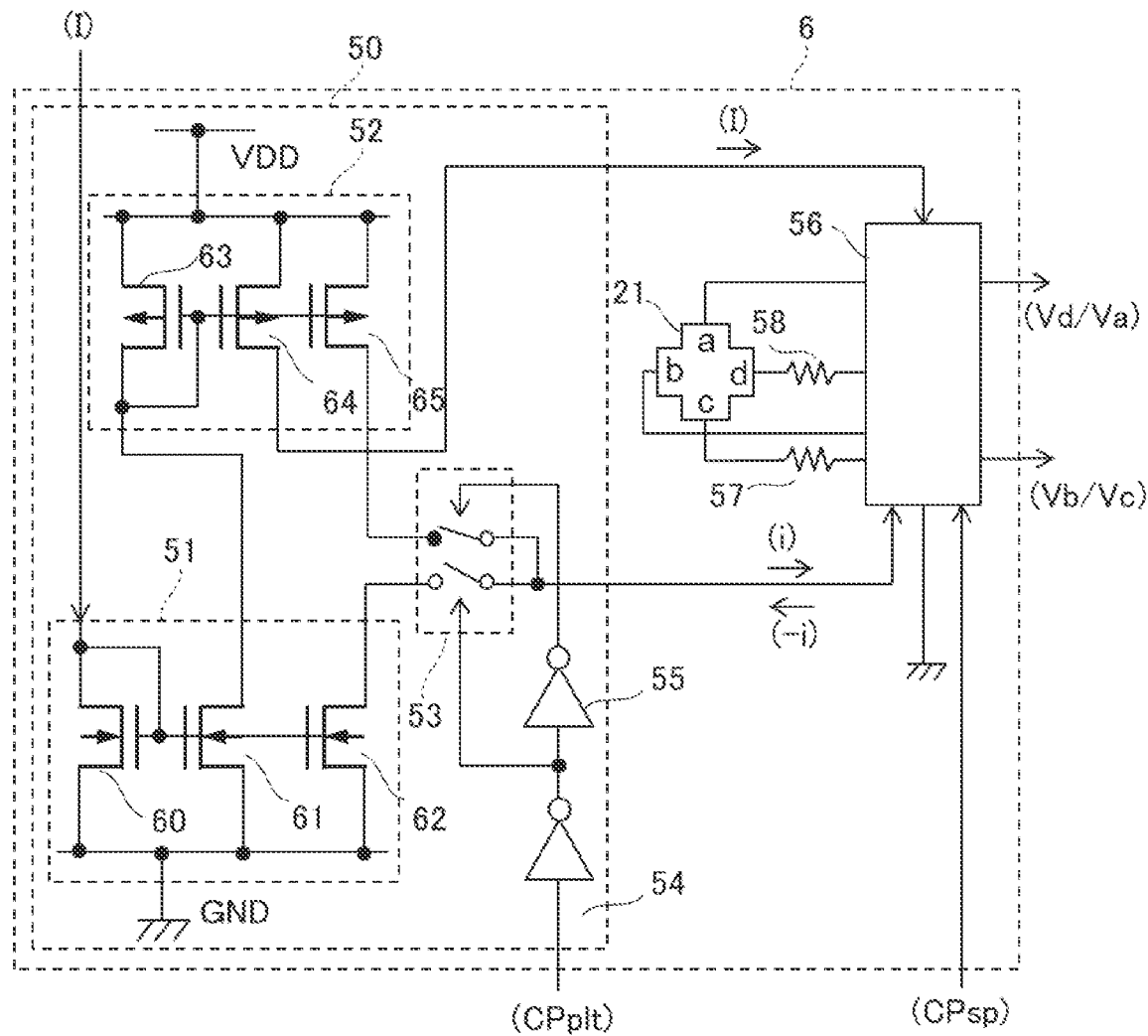
FIG. 22 is a circuit diagram for illustrating an example of a magnetic sensor circuit in the second embodiment.

Referring to FIG. 22, the magnetic sensor circuit 6 configured to measure the magnetic field with the Hall element 21 is described. The magnetic sensor circuit 6 includes the Hall element 21 configured to perform a spinning current operation, a switch circuit 56, two resistors 57 and 58, and a current supply circuit 50 configured to supply an electric current to the Hall element 21. The Hall element 21 is switched in connection with the switch circuit 56, and is configured to remove an offset voltage of an output signal under application of no magnetism through operation using a spinning current method. The switch circuit 56 has two current input terminals, a GND connection terminal, four Hall element connection terminals, a clock input terminal, and two output terminals. The Hall element 21 has four terminals: terminals "a" to "d", and is connected to the switch circuit 56. Here, the first resistor 57 is connected in series between the terminal "c" of the Hall element 21 and the switch circuit 56, and the second resistor 58 is connected in series between the terminal "d" of the Hall element 21 and the switch circuit 56.

Figure 23:
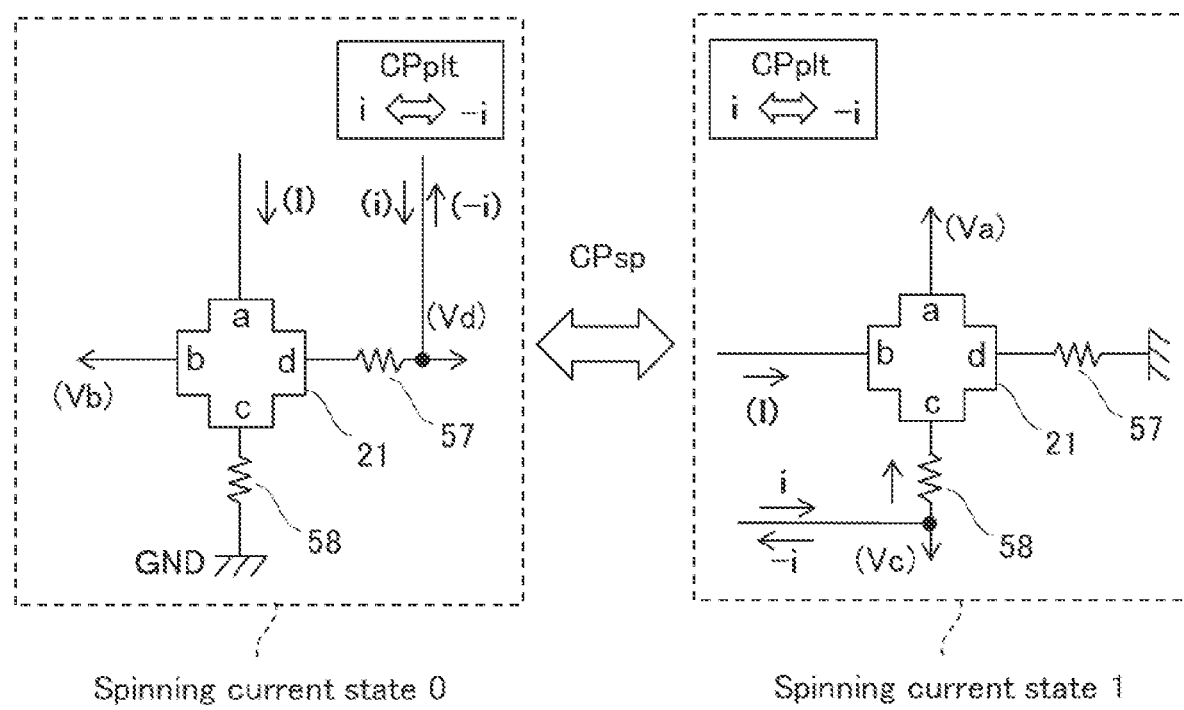
FIG. 23 is a diagram for illustrating spinning current states of a Hall element in the second embodiment.

Referring to FIG. 23, the spinning current operation of the Hall element 21 is described. The spinning current operation is similar to the operation described in the first embodiment and FIG. 3, but is different from the first embodiment in the addition of the two resistors, and in input and output of an electric current "i". Because the amplifier 11 in a subsequent stage configured to amplify the output of the Hall element 21 is an amplifier having a high input impedance, the electric current "i" flows to the GND via the two resistors and the Hall element 21.

In the Hall element 21, under a spinning current state 0, the electric current I is supplied to the terminal "a", is discharged from the terminal "c", and flows to the GND via the resistor 58. The Hall element 21 is configured to generate a potential that is proportional to a magnetic field perpendicular to the Hall element 21 and is proportional to the electric current I between the terminal "b" and the terminal "d", and supply the potential as the voltage Vb from the terminal "b", and as the voltage Vd from the terminal "d" via the resistor 57. Meanwhile, a product of a resistance value of the resistor 57 and the electric current "i" is added as an offset voltage to the output of the Hall element 21. The voltage Vd is a sum of a Hall voltage generated by the Hall element 21 and the offset voltage. At the same time, a voltage drop also occurs across both ends of the resistor 58 with the electric current "i". Because the output of the Hall element 21 is the differential signals, the voltage drop that occurs across the both ends of the resistor 58 does not affect the output of the Hall element 21.

In the Hall element 21, under a spinning current state 1, the electric current I is supplied to the terminal "b", is discharged from the terminal "d", and flows to the GND via the resistor 57. The Hall element 21 is configured to generate a potential that is proportional to a magnetic field perpendicular to the Hall element 21 and is proportional to the electric current I between the terminal "a" and the terminal "c", and supply the potential as the voltage Va from the terminal "a", and as the voltage Vc from the terminal "c" via the resistor 58. Meanwhile, a product of a resistance value of the resistor 58 and the electric current "i" is added as an offset voltage to the output of the Hall element 21. The voltage Vc is a sum of a Hall voltage generated by the Hall element 21 and the offset voltage. At the same time, a voltage drop also occurs across both ends of the resistor 57 with the electric current "i". Because the output of the Hall element 21 is the differential signals, the voltage drop that occurs across the both ends of the resistor 57 does not affect the output of the Hall element 21.

The voltage drops that occur across the resistor 57 and the resistor 58 are set to the same level as the Hall voltage generated by the Hall element 21 to correspond to the measured magnetic field. In order to adjust the voltage drops that occur across the resistor 57 and the resistor 58, resistance values of the resistor 57 and the resistor 58 may be adjustable with an external signal or by trimming. With the electric current "i" being proportional to the electric current I, and with the resistor 57 and the resistor 58 being produced by the same process recipe as the Hall element 21, voltages generated in the resistor 57 and the resistor 58 are correlated to the Hall voltage generated in the Hall element 21 by the measured magnetic field. The voltages generated in the resistor 57 and the resistor 58 may be used as sensitivity monitors for the Hall element 21.

Switching between the spinning current state 0 and the spinning current state 1 is performed by the clock CPsp signal being supplied to the switch circuit 56. The switch circuit 56 supplies a voltage Vd/Va from a first output terminal, and a voltage Vb/Vc from a second output terminal.

Referring to FIG. 22, the current supply circuit 50 is described. The current supply circuit 50 includes two current mirror circuits 51 and 52, a switch circuit 53, two inverters 54 and 55, a current input terminal, and two current output terminals. The current mirror circuit 51 includes three MOS transistors 60, 61, and 62. The current mirror circuit 52 includes three MOS transistors 63, 64, and 65. A mirror ratio between the MOS transistor 60 and the MOS transistor 61 is 1:1. A mirror ratio between the MOS transistor 63 and the MOS transistor 64 is 1:1. The electric current I received from the current input terminal flows through the MOS transistor 60, and is current-mirrored as the electric current I by the MOS transistor 61. The electric current I current-mirrored by the MOS transistor 61 flows through the MOS transistor 63, and is current-mirrored as the electric current I by the MOS transistor 64. The electric current I current-mirrored by the MOS transistor 64 is supplied to the Hall element 21 via the switch circuit 56.

The MOS transistor 65 is configured to current-mirror the electric current I with the MOS transistor 63 at a predetermined mirror ratio to generate the electric current "i". The mirror ratio is determined so as to obtain the electric current "i" with which the voltage drop caused by the electric current "i" and the resistor 57 or the resistor 58 is at the same level as the Hall voltage generated by the Hall element 21 as described above. The MOS transistor 65 may be formed of a plurality of MOS transistors connected in parallel so that some of the MOS transistors may be disconnected by the external signal or the trimming to adjust the mirror ratio. As with the MOS transistor 65, the MOS transistor 62 is configured to current-mirror the electric current I with the MOS transistor 60 at a predetermined mirror ratio to generate an electric current −i. The MOS transistor 62 may also be formed of a plurality of MOS transistors connected in parallel, and the MOS transistors may be disconnected by the external signal or the trimming.

One of the electric current "i" and the electric current −i is selected by the clock CPplt signal, and is supplied to the Hall element 21 via the switch circuit 56, and further via the resistor 57 or the resistor 58. Under the spinning current state 0, the current supply circuit 50 switches between the electric current "i" and the electric current −i to be supplied to the Hall element 21 with the clock CPplt signal at a duty ratio of 50%. Similarly under the spinning current state 1, the current supply circuit 50 switches between the electric current "i" and the electric current −i to be supplied to the Hall element 21 with the clock CPplt signal at the duty ratio of 50%. The signals supplied by the magnetic sensor circuit 6 to correspond to the electric current "i" and the electric current −i are called "pilot signals" as in the first embodiment. The current supply circuit 50 operates as the pilot signal generating circuit, and thereby generates the pilot signals superimposed on the output signal supplied from the Hall element 21.

The magnetic sensor circuit 6 is configured to supply a signal obtained by superimposing a signal corresponding to the measured magnetic field penetrating the Hall element 21 with the pilot signals. The signals Vd/Va and Vb/Vc supplied by the magnetic sensor circuit 6 are supplied to the chopper modulator/demodulator circuit 3. Circuit configurations and operation in the chopper modulator/demodulator circuit 3 and subsequent elements are the same as in the first embodiment.

According to the magnetic sensor device of the second embodiment, frequency orthogonality of the signal (I side) corresponding to the measured magnetic field and the pilot signals (Q side) can be used to operate the magnetic sensor device not by time division operation but through adjustment of magnetic field measuring sensitivity of the I-side signal with the Q-side signal at all times.

What is claimed is:

1. A magnetic sensor device, comprising:
   a current input terminal;
   a voltage input terminal;
   an output terminal;
   a magnetic sensor circuit including a first terminal, one of one Hall element and a set of Hall elements connected in parallel to each other, and a pilot signal generating circuit;
   a chopper modulator/demodulator circuit including a first mixer connected to the magnetic sensor circuit, an amplifier containing an input port connected to the first mixer, a second mixer containing an input port connected to the amplifier, and an output port connected to the output terminal; and
   a feedback circuit including a second terminal connected to the chopper modulator/demodulator circuit, a third mixer, a voltage-current conversion circuit, and a third terminal connected to the current input terminal and the first terminal, and a fourth terminal connected to the voltage input terminal.

2. The magnetic sensor device according to claim 1, wherein the pilot signal generating circuit is a magnetic field generating circuit.

3. The magnetic sensor device according to claim 1, wherein the pilot signal generating circuit is a current supply circuit.

4. The magnetic sensor device according to claim 1, wherein each of the first mixer, the second mixer, and the third mixer is a passive multiplier formed of switches.

5. The magnetic sensor device according to claim 1, wherein the voltage-current conversion circuit is a transconductance amplifier.

6. The magnetic sensor device according to claim 1, wherein the voltage-current conversion circuit includes an AD converter, a digital signal processor, and a current output DA converter.

* * * * *